(12) United States Patent
Yamaguchi et al.

(10) Patent No.: US 11,018,039 B2
(45) Date of Patent: May 25, 2021

(54) ELECTROSTATIC CHUCK WHICH REDUCES ARC DISCHARGE

(71) Applicant: TOTO LTD., Kitakyushu (JP)

(72) Inventors: Kosuke Yamaguchi, Kitakyushu (JP); Jun Shiraishi, Kitakyushu (JP); Ikuo Itakura, Kitakyushu (JP); Yutaka Momiyama, Kitakyushu (JP); Shuichiro Saigan, Kitakyushu (JP)

(73) Assignee: Toto Ltd., Fukuoka (JP)

( * ) Notice: Subject to any disclaimer, the term of this patent is extended or adjusted under 35 U.S.C. 154(b) by 138 days.

(21) Appl. No.: 16/352,899

(22) Filed: Mar. 14, 2019

(65) Prior Publication Data

US 2019/0287839 A1    Sep. 19, 2019

(30) Foreign Application Priority Data

Mar. 14, 2018 (JP) .............................. JP2018-047009
Oct. 30, 2018 (JP) .............................. JP2018-203725

(51) Int. Cl.
| | | |
|---|---|---|
| *H01L 21/683* | (2006.01) | |
| *H01L 21/67* | (2006.01) | |
| *H01L 21/687* | (2006.01) | |

(52) U.S. Cl.
CPC .... *H01L 21/6833* (2013.01); *H01L 21/67109* (2013.01); *H01L 21/6831* (2013.01); *H01L 21/68757* (2013.01)

(58) Field of Classification Search
CPC ........... H01L 21/67109; H01L 21/6831; H01L 21/6833; H01L 21/68757

USPC .................................................. 361/230–234
See application file for complete search history.

(56) References Cited

U.S. PATENT DOCUMENTS

| | | | |
|---|---|---|---|
| 5,720,818 A | 2/1998 | Donde et al. | |
| 7,697,260 B2* | 4/2010 | Brown | ................ H01L 21/6831 361/234 |
| 9,960,067 B2* | 5/2018 | Anada | ................. H01L 21/6833 |
| 2009/0230636 A1 | 9/2009 | Goto | |

(Continued)

FOREIGN PATENT DOCUMENTS

| | | |
|---|---|---|
| JP | 2003-338492 A | 11/2003 |
| JP | 2009-218592 A | 9/2009 |

(Continued)

*Primary Examiner* — Yemane Mehari
(74) *Attorney, Agent, or Firm* — Carrier Blackman & Associates, P.C.; Joseph P. Carrier; William D. Blackman

(57) ABSTRACT

According to the embodiment, the electrostatic chuck includes a ceramic dielectric substrate having a first major surface and a second major surface on an opposite side to the first major surface, a base plate supporting the ceramic dielectric substrate and including a gas introduction path, and a first porous part provided at a position between the base plate and the first major surface and being opposite to the gas introduction path. The ceramic dielectric substrate includes a first hole part positioned between the first major surface and the first porous part. At least one of the ceramic dielectric substrate or the first porous part includes a second hole part positioned between the first hole part and the first porous part, and a dimension of the second hole part is smaller than a dimension of the first porous part and larger than a dimension of the first hole part.

15 Claims, 11 Drawing Sheets

(56) References Cited

U.S. PATENT DOCUMENTS

| | | | |
|---|---|---|---|
| 2010/0122774 A1* | 5/2010 | Makabe | H01L 21/67109 |
| | | | 156/345.52 |
| 2013/0027838 A1 | 1/2013 | Hori et al. | |
| 2015/0279714 A1 | 10/2015 | Yamaguchi et al. | |
| 2017/0178944 A1 | 6/2017 | Yamaguchi et al. | |
| 2017/0358476 A1* | 12/2017 | Horiuchi | H01L 21/67017 |
| 2019/0287838 A1* | 9/2019 | Yamaguchi | H01L 21/68757 |
| 2019/0287839 A1* | 9/2019 | Yamaguchi | H01L 21/67109 |

FOREIGN PATENT DOCUMENTS

| | | |
|---|---|---|
| JP | 2010-123712 A | 6/2010 |
| KR | 2012-0120415 A | 11/2012 |
| TW | 2015-37673 A | 10/2015 |

\* cited by examiner

ELECTROSTATIC CHUCK WHICH REDUCES ARC DISCHARGE

CROSS-REFERENCE TO RELATED APPLICATIONS

This application is based upon and claims the benefit of priority from Japanese Patent Application No. 2018-047009, filed on Mar. 14, 2018; Japanese Patent Application No. 2018-203725, filed on Oct. 30, 2018; the entire contents of which are incorporated herein by reference.

FIELD

Embodiments described herein relate generally to an electrostatic chuck.

BACKGROUND

An electrostatic chuck made of ceramic manufactured by sandwiching electrodes between ceramic electrostatic substrates made of alumina and firing them applies an electrostatic suction power to built-in electrodes and sucks a substrate such as a silicon wafer or the like by an electrostatic force. In the electrostatic chuck like this, an inactive gas such as helium (He) or the like is flown between a surface of the ceramic dielectric substrate and a back side of the substrate being a suction object, and a temperature of the substrate being the suction object is controlled.

For example, temperature increase of the substrate may be accompanied during processing in a CVD (Chemical Vapor Deposition) apparatus, a sputtering apparatus, an ion implantation apparatus, an etching apparatus or the like in which the substrate is processed. In the electrostatic chuck used for those apparatus, an inactive gas such as He or the like is flown between the ceramic dielectric substrate and the substrate being the suction object, and the temperature increase of the substrate is suppressed by bringing the inactive gas into contact with the substrate.

In the electrostatic chuck which controls the substrate temperature by the inactive gas such as He or the like, holes (gas introduction path) for introducing the inactive gas such as He or the like are provided in the ceramic dielectric substrate and a base plate supporting the ceramic dielectric substrate. Through holes communicating with the gas introduction path of the base plate are provided in the ceramic dielectric substrate. Thereby, the inactive gas introduced from the gas introduction path of the base plate is introduced to a back side of the substrate through the through holes of the ceramic dielectric substrate.

Here, when processing the substrate in the apparatus, discharge (arc discharge) from the plasma in the apparatus toward the base plate made of a metal may be generated. The gas introduction path of the base plate and the through hole of the ceramic dielectric substrate may be likely to be a path for discharge. Then, there is a technique that resistance (breakdown voltage or the like) to the arc discharge is improved by providing a porous part in the gas introduction path of the base plate and the through hole of the ceramic dielectric substrate. For example, an electrostatic chuck is disclosed, which insulation property in the gas introduction path is improved by providing a ceramic sintered porous body in the gas introduction path and making a ceramic sintered porous body structure and a film pore a gas flow path. An electrostatic chuck is disclosed, which a discharge prevention member made of the ceramic porous body and being a process gas flow path for preventing the discharge is provided in a gas diffusion gap. An electrostatic chuck is disclosed, which a dielectric insert is provided as a porous dielectric such as alumina and the arc discharge is reduced. It is desired to reduce the arc discharge and facilitate the gas flow in the electrostatic chuck including the porous part like this.

DETAILED DESCRIPTION

Figure 1:
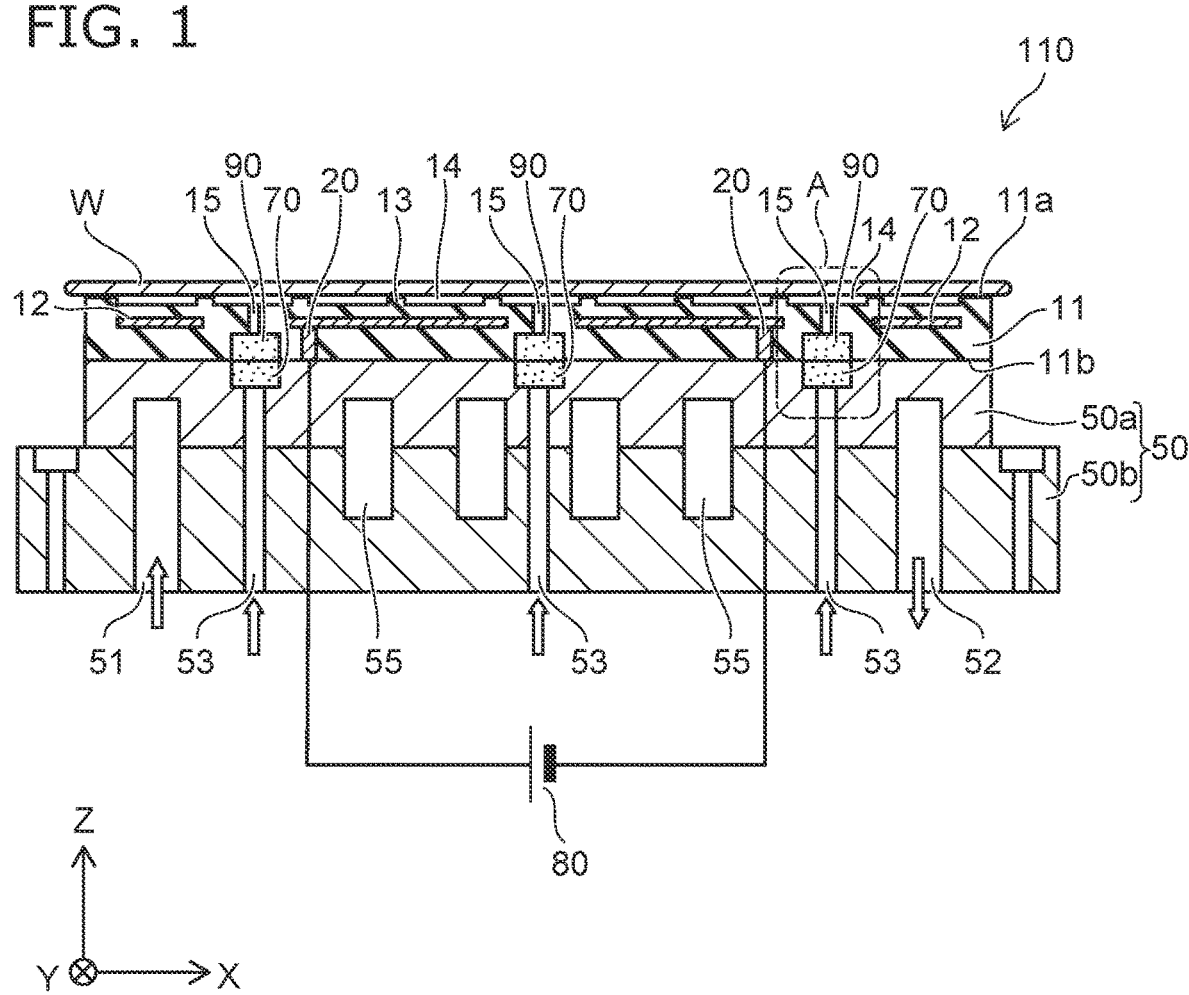
FIG. 1 is a schematic cross sectional view illustrating an electrostatic chuck according to an embodiment.

The first invention relates to an electrostatic chuck. The electrostatic chuck includes a ceramic dielectric substrate having a first major surface placing a suction object and a second major surface on an opposite side to the first major surface, a base plate supporting the ceramic dielectric substrate and including a gas introduction path, and a first porous part provided at a position between the base plate and the first major surface of the ceramic dielectric substrate and being opposite to the gas introduction path. The ceramic dielectric substrate includes a first hole part positioned between the first major surface and the first porous part. At least one of the ceramic dielectric substrate or the first porous part includes a second hole part positioned between the first hole part and the first porous part, and in a second direction perpendicular to a first direction from the base plate toward the ceramic dielectric substrate, a dimension of the second hole part is smaller than a dimension of the first porous part and larger than a dimension of the first hole part.

According to the electrostatic chuck, while securing a flow rate of gas flowing through the first hole part by the first porous part provided at the position facing the gas introduction path, a resistance to an arc discharge can be improved. Since the second hole part having a prescribed dimension is provided, most of the gas introduced in the first porous part with a large dimension can be introduced into the first hole part with a small dimension via the second hole part. That is, the arc discharge can be reduced and the gas flow can be facilitated.

The second invention relates to the electrostatic chuck in the first invention, wherein the second hole part is provided in the ceramic dielectric substrate.

According to the electrostatic chuck, since the second hole part is provided in the ceramic dielectric substrate, a strength around the second hole part can be increased, and thus the generation of chipping or the like around the second hole part can be suppressed. For that reason, the arc discharge can be suppressed from being generated more effectively.

The third invention related to the electrostatic chuck in the first or second inventions, wherein the second hole part is provided in the first porous part.

According to the electrostatic chuck, the alignment of the second hole part and the first porous part becomes easy. The reduction of the arc discharge and the facilitation of the gas flow can be more easily compatible.

The fourth invention relates to the electrostatic chuck in the one of the first to third inventions, wherein the ceramic dielectric substrate further includes at least one groove communicating with the first hole part and opening to the first major surface. A dimension of the second hole part is smaller than a dimension of the groove in the first direction.

According to the electrostatic chuck, the gas can be supplied to the first major surface side via the groove 14. For that reason, the gas can be easily supplied to broader area of the first major surface. Since the dimension of the second hole part in the first direction is made smaller than the dimension of the groove, while facilitating the gas flow, the arc discharge can be suppressed from being generated more effectively.

The fifth invention relates to the electrostatic chuck in one of the first to fourth inventions, further comprising: an adhesion part provided between the ceramic dielectric substrate and the base plate. A dimension of the second hole part is smaller than a dimension of the adhesion part in the first direction.

According to the electrostatic chuck, the joining strength between the ceramic dielectric substrate and the base plate can be improved. Since the dimension of the second hole part in the first direction is made smaller than the dimension of the adhesion part, while facilitating the gas flow, the arc discharge can be suppressed from being generated more effectively.

The sixth invention relates to the electrostatic chuck in one of the first to fifth inventions, further comprising: an electrode provided between the first major surface and the second major surface. A distance in a second direction between a porous region provided in the first porous part and the electrode is longer than a distance in a first direction between the first major surface and the electrode.

According to the electrostatic chuck, the discharge in the first porous part can be suppressed by lengthen the distance in the second direction between the porous region provided in the first porous part and the electrode. The suction force of the object placed on the first major surface can be increased by shortening the distance in the first direction between the first major surface and the electrode.

The seventh invention relates to the electrostatic chuck in one of the first to sixth inventions, further comprising: a second porous part provided between the first porous part and the gas introduction path. A dimension of the second porous part is larger than a dimension of the first porous part in the second direction.

According to the electrostatic chuck, since a higher breakdown voltage can be obtained by providing the second porous part, the arc discharge can be suppressed from being generated more effectively.

The eighth invention relates to the electrostatic chuck in one of the first to seventh inventions, further comprising: a second porous part provided between the first porous part and the gas introduction path and including a plurality of pores. An average value of diameters of the plurality of pores provided in the second porous part is larger than an average value of diameters of the plurality of pores provided in the first porous part.

According to the electrostatic chuck, since the second porous part having a large pore diameter is provided, the gas flow can be facilitated. Since the first porous part having a small pore diameter is provided on the suction object side, the arc discharge can be suppressed from being generated more effectively.

The ninth invention relates to electrostatic chuck in one of the first to eighth inventions, further comprising: a second porous part provided between the first porous part and the gas introduction path and including a plurality of pores. Fluctuation of diameters of the plurality of pores provided in the first porous part is smaller than fluctuation of diameters of a plurality of pores provided in the second porous part.

According to the electrostatic chuck, since the fluctuation of the diameters pf the plurality of pores provided in the first porous part is smaller than the fluctuation of the diameters of the plurality of pores provided in the second porous part, the arc discharge can be suppressed from being generated more effectively.

The tenth invention relates to the electrostatic chuck in one of the seventh to ninth inventions, wherein a dimension of the second porous part is larger than a dimension of the first porous part in the first direction.

According to the electrostatic chuck, since a higher breakdown voltage can be obtained, the arc discharge can be suppressed from being generated more effectively.

The eleventh invention relates to the electrostatic chuck in one of the seventh to tenth inventions, wherein a plurality of pores provided in the second porous part are more dispersed three dimensionally than a plurality of pores provided in the first porous part, and a ratio of pores piercing in the first direction is larger in the first porous part than the second porous part.

An example that the pores are dispersed three dimensionally will be described later with reference to FIG. 10.

According to the electrostatic chuck, since the higher breakdown voltage can be obtained by providing the second porous part including the plurality of pores dispersed three dimensionally, the arc discharge can be suppressed from being generated more effectively. The gas flow can be facilitated by providing the first porous part having a large ratio of pores piercing in the first direction.

Twelfth invention relates to the electrostatic chuck in one of the first to eleventh inventions, wherein the first porous part and the ceramic dielectric substrate include aluminum oxide as a main component, and a purity of aluminum oxide of the ceramic dielectric substrate is higher than a purity of aluminum oxide of the first porous part.

According to the electrostatic chuck, the performance of the resistance to plasma or the like of the electrostatic chuck can be secured, and the mechanical strength of the first porous part can be secured. As one example, sintering of the first porous part is assisted by including a fine amount of additive to the first porous part, and it is possible to secure the control of the pore and to secure the mechanical strength.

The thirteenth invention relates to the electrostatic chuck in one of the first to twelfth inventions, wherein the first porous part includes a plurality of sparse portions and a dense portion, the sparse portions including a plurality of pores including the first pore and the second pore, the dense portion having a density higher than a density of the sparse portions, each of the plurality of sparse portions extends in the first direction, the dense portion is positioned between the plurality of sparse portions, the sparse portions include a wall part provided between the first pore and the second pore, and a minimum value of a dimension of the wall part is smaller than a minimum value of a dimension of the dense portion in the second direction.

According to the electrostatic chuck, since the sparse portions and the dense portion which extend in the first direction are provided in the first porous part, while securing the resistance to the arc discharge and the gas flow rate, the mechanical strength (rigidity) of the first porous part can be improved.

The fourteenth invention relates to the electrostatic chuck in the thirteenth invention, wherein a dimension of the plurality of pores provided in each of the plurality of sparse portions is smaller than a dimension of the dense portion in the second direction.

According to the electrostatic chuck, since the dimension of the plurality of pores can be made sufficiently small, the resistance to the arc discharge can be further improved.

The fifteenth invention relates to the electrostatic chuck in the thirteenth or fourteenth inventions, wherein an aspect ratio of the plurality of pores provided in each of the plurality of sparse portions is not less than 30 and not more than 1000.

According to the electrostatic chuck, the resistance to the arc discharge can be further improved.

The sixteenth invention relates to the electrostatic chuck in one of the thirteenth or fifteenth inventions, wherein a dimension of the plurality of pores provided in each of the plurality of sparse portions is not less than 1 micrometer and not more than 20 micrometers in the second direction.

According to the electrostatic chuck, since the pores having the dimension of 1 to 20 micro meters and extending in one direction can be arranged, the high resistance to the arc discharge can be realized.

The seventeenth invention relates to the electrostatic chuck in one of the thirteenth or sixteenth inventions, wherein when viewed along the first direction, the first pore is positioned at a center portion of the sparse portions, and a number of pores of the plurality of pores adjacent to the first pore and surrounding the first pore is 6.

According to the electrostatic chuck, in a plan view, it is possible to dispose the plurality of pores with high isotropy and high density. Thereby, while securing the resistance to the arc discharge and the flow rate of the flowing gas, the rigidity of the first porous part can be improved.

Various embodiments will be described hereinafter with reference to the accompanying drawings.

In the drawings, the same reference numbers are applied to the same elements and the detailed description will be omitted as appropriate.

FIG. 1 is a schematic cross sectional view illustrating an electrostatic chuck according to the embodiment.

As shown in FIG. 1, an electrostatic chuck 110 according to the embodiment includes a ceramic dielectric substrate 11, a base plate 50 and a first porous part 90.

The ceramic dielectric substrate 11 is, for example, a plate-shaped base material of sintered ceramic. For example, the ceramic dielectric substrate 11 includes aluminum oxide ($Al_2O_3$). For example, the ceramic dielectric substrate 11 is formed of a high purity aluminum oxide. A concentration of aluminum oxide in the ceramic dielectric substrate 11 is, for example, not less than 99 atomic percent (atomic %) and not more than 100 atomic %. Plasma resistance of the ceramic dielectric substrate 11 can be improved by using the high purity aluminum oxide. The ceramic dielectric substrate 11 has a first major surface 11a having a suction object W placed and a second major surface 11b on an opposite side to the first major surface 11a. The suction object W is, for example, a semiconductor substrate such as a silicon wafer or the like.

An electrode 12 is provided on the ceramic dielectric substrate 11. The electrode 12 is provided between the first major surface 11a and the second major surface 12b of the ceramic dielectric substrate 11. The electrode 12 is formed to be inserted into the ceramic dielectric substrate 11. The electrostatic chuck 110 generates a charge on the first major surface 11a side of the electrode 12 and sucks and holds the object W by an electrostatic force produced by application of a suction holding voltage 80 to the electrode 12.

Here, in the description of the embodiment, a direction from the base plate 50 toward the ceramic dielectric substrate 11 is taken as a Z-direction (corresponding to one example of a first direction), one of directions substantially perpendicular to the Z-direction is taken as A Y-direction (corresponding to one example of a second direction), and a direction substantially perpendicular to the Z-direction and the Y-direction is taken as an X-direction (corresponding to one example of a second direction).

A shape of the electrode 12 is film-shaped along the first major surface 11a and the second major surface 11b of the ceramic dielectric substrate 11. The electrode 12 is a suction electrode for sucking and holding the object W. The electrode 12 may be either unipolar type or bipolar type. The electrode shown in FIG. 1 is bipolar type, and 2 pole electrodes 12 are provided on the same plane.

The electrode 12 is provided with a connection part 20 extending to the second major surface 11b side of the ceramic dielectric substrate 11. The connection part 20 is, for example, a via (solid type) and a via hole (hollow type) communicating with the electrode 12. The connection part 20 may be a metal terminal connected by an adequate method such as brazing.

The base plate 50 is a member supporting the ceramic dielectric substrate 11. The ceramic dielectric substrate 11 is fixed onto the base plate 50 by an adhesion part 60 shown in FIG. 2A. The adhesion part 60 can be, for example, a hardened silicone adhesive.

The base plate 50 is, for example, made of a metal. The base plater 50 is, for example, divided into an upper portion 50a and a lower portion 50b made of aluminum, and a communicating passage 55 is provided between the upper portion 50a and the lower portion 50b. One end side of the communicating passage 55 is connected to an input path 51, and the other end side of the communicating passage 55 is connected to an output path 52.

The base plate 50 also plays a role to adjust a temperature of the electrostatic chuck 110. For example, when cooling the electrostatic chuck 110, a cooling medium is flown in from the input path 51, is passed through the communicating passage 55, and is flown out from the output path 52. Thereby, a heat of the base plate 50 is absorbed by the cooling medium, and the ceramic dielectric substrate 11 installed thereon can be cooled. On the other hand, when holding the electrostatic chuck 110 warm, it is also possible to put a heat holding medium in the communicating passage 55. It is also possible to incorporate a heating element in the ceramic dielectric substrate 11 and the base plate 50. The temperature of the object W to be sucked and held by the electrostatic chuck 110 can be adjusted by adjusting the temperature of the base plate 50 and the ceramic dielectric substrate 11.

Dots 13 are provided on the first major surface 11a side of the ceramic dielectric substrate 11 as necessary, and a groove 14 is provided between the dots 13. That is, the first major surface 11a is an uneven surface and includes a recess and a protrusion. The protrusion of the first major surface corresponds to a dot 13 and the recess of the first major surface corresponds to the recess. The groove 14 extends continuously in the XY plane. A space is formed between the back side of the object W placed on the electrostatic chuck 110 and the first major surface 11a including the groove 14.

The ceramic dielectric substrate 11 includes a through hole 15 connected to the groove 14. The through hole 15 is provided from the second major surface 11b toward the first major surface 11a. That is, the through hole 15 extends from the second major surface 11b to the first major surface 11a in the Z-direction and pierces the ceramic dielectric substrate 11.

The temperature of the object W and the particles adhering to the object W can be controlled in a favorable state by adequately selecting a height of the dot 13 (a depth of the groove 14), an area ratio and shapes or the like of the dot 13 and the groove 14.

A gas introduction path 53 is provided in the base plate 50. The gas introduction path 53 is provided, for example, to pierce the base plate 50. The gas introduction path 53 may be provided to reach the ceramic dielectric substrate 11 side by diverging from the middle of the other gas introduction path 53 without piercing the base plate 50. The gas introduction path 53 may be provided at multiple positions of the base plate 50.

The gas introduction path 52 is communicated with the through hole 15. That is, the gas (helium (He) or the like) which flows in the gas introduction path 53 flows in the through hole 15 after passing through the gas introduction path 53.

The gas which flows in the gas introduction path 53 flows in the space provided between the object W and the first major surface 11a including the groove 14 after passing through the through hole 15. Thereby, the object w can be cooled directly by the gas.

The first porous part 90 can be provided, for example, at a position facing the gas introduction path 53, the position being between the base plate 50 and the first major surface 11a of the ceramic dielectric substrate 11 in the Z-direction. For example, the first porous part 90 is provided in the through hole 15 of the ceramic dielectric substrate 11. For example, the first porous part 90 is inserted into the through hole 15.

Figure 2A:
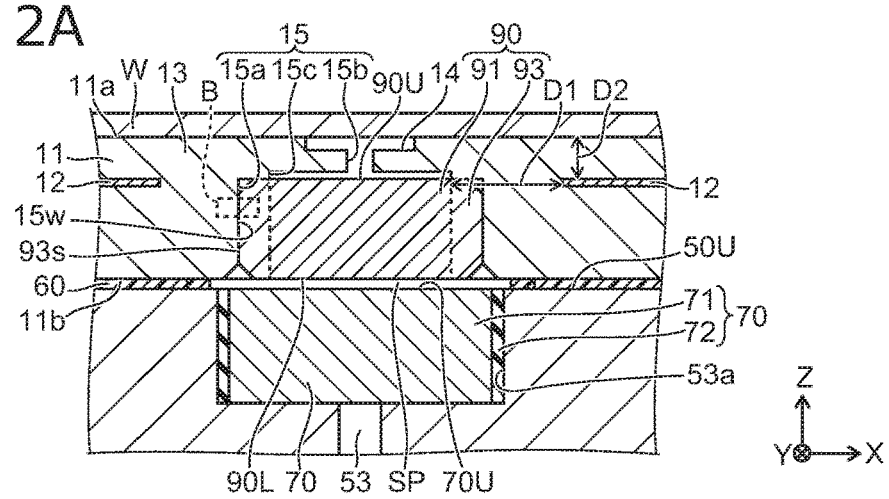
FIG. 2A and FIG. 2B are schematic views illustrating the electrostatic chuck according to the embodiment.
Figure 2B:
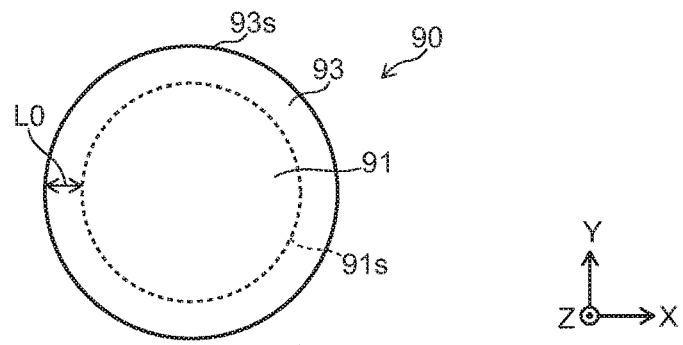

FIG. 2A and FIG. 2B are schematic views illustrating the electrostatic chuck according the embodiment. FIG. 2A illustrates around the first porous part 90. FIG. 2A corresponds to an enlarged view of a region A shown in FIG. 1. FIG. 2B is a plan view illustrating the first porous part 90.

Figure 2C:
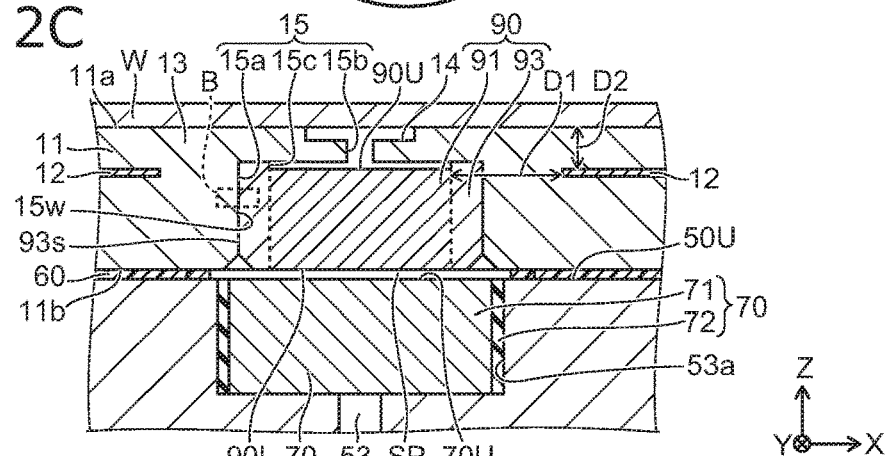
FIG. 2C and FIG. 2D are schematic cross sectional views for illustrating a hole part 15c according to other embodiment.
Figure 2D:
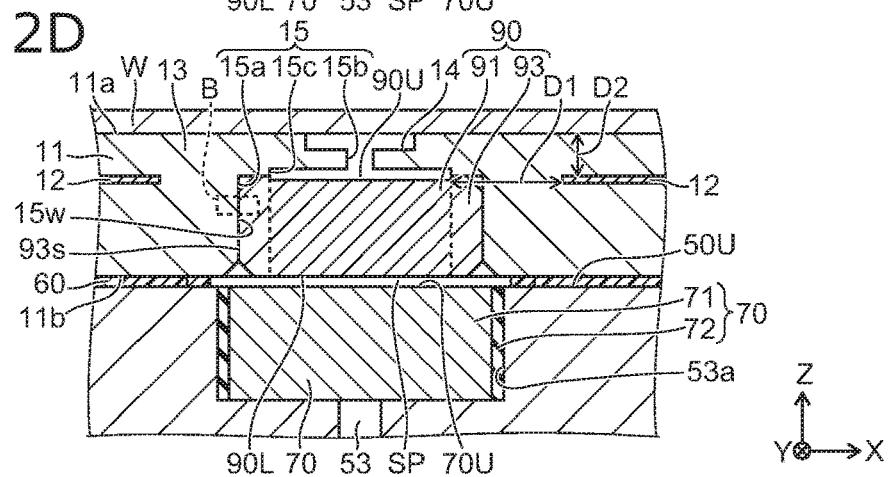

FIG. 2C and FIG. 2D are schematic cross sectional views for illustrating a hole part 15c according to other embodiment.

In order to be not complicated, dots 13 (for example, see FIG. 1) are omitted in FIG. 2A, FIG. 2C, FIG. 2D.

In this example, the through hole 15 includes a hole part 15a, and a hole part 15b (corresponding to one example of a first hole part). One end of the hole part 15a is positioned on the second major surface 11b of the ceramic dielectric substrate 11.

The ceramic dielectric substrate 11 can include the hole part 15b positioned between the first major surface 11a and the first porous part 90 in the Z-direction. The hole part 15b is communicated with the hole part 15a and extends to the first major surface 11a of the ceramic dielectric substrate 11. That is, one end of the hole part 15b is positioned on the first major surface 11a (groove 14). The hole part 15b is a connecting hole connecting the first porous part 90 and the groove 14. A dimeter of the hole part 15b (a length along the X-direction) is smaller than a diameter of the hole part 15a (a length along the X-direction). Design freedom of the space formed between the ceramic dielectric substrate 11 and the object W (for example, the first major surface 11a including the groove 14) can be increased by providing the hole part 15b with a small diameter. For example, as shown in FIG. 2A, a width of the groove 14 (a length along the X-direction) can be shorter than a width of the first porous part 90 (a length along the X-direction). Thereby, for example, the discharge in the space formed between the ceramic dielectric substrate 11 and the object W can be suppressed.

The diameter of the hole part 15b is, for example, not less than 0.05 millimeters (mm) and not more than 0.5 mm. The diameter of the hops part 15a is, for example, not less than 1 mm and not more than 5 mm. The hole part 15b may be communicated with the hole part 15b indirectly. That is, the hole part 15c (corresponding to one example of a second hole part) connecting the hole part 15a and the hole part 15b may be provided. As shown in FIG. 2A, the hole part 15c can be provided in the ceramic dielectric substrate 11. As shown in FIG. 2C, the hole part 15c can also be provided in the first porous part 90. As shown in FIG. 2D, the hole part 15c can also be provided in the ceramic dielectric substrate 11 and the first porous part 90. That is, at least one of the ceramic dielectric substrate 11 and the first porous part 90 can include the hole part 15c positioned between the hole part 15b and the first porous part 90. In this case, if the hole part 15c is provided in the ceramic dielectric substrate 11, a strength around the hole part 15c can be increased, and the generation of chipping or the like around the hole part 15c can be suppressed. For that reason, the arc discharge can be suppressed from being generated more effectively. If the hole part 15c is provided in the first porous part 90, the alignment of the hole part 15c and the first porous part 90 becomes easy. For that reason, the reduction of the arc discharge and the facilitation of the gas flow can be more easily compatible. Each of the hole part 15a, the hole part 15b and the hole part 15c is cylindrical and extends in the Z-direction.

In this case, a dimension of the hole part 15c can be smaller than a dimension of the first porous part 90 and larger than a dimension of the hole part 15b in the X-direction or the Y-direction. According to the electrostatic chuck 110 of the embodiment, while securing the flow rate flowing through the hole part 15b by the first porous part 90 provided at the position facing the gas introduction path 53, the resistance to the arc discharge can be improved. Since the dimension of the hole part 15c in the X-direction or the Y-direction is made larger than the dimension of the hole part 15b, most of the gas introduced in the first porous part 90 with the large dimension can be introduced into the hole part 15b with the small dimension via the hole part 15c. That is, the arc discharge can be reduced and the gas flow can be facilitated.

As described previously, the ceramic dielectric substrate 11 includes at least one groove 14 communicating with the first hole part 15 and opens to the first major surface 11a. The dimension of the hole part 15c can be smaller than the dimension of the groove 14 in the Z-direction. In this way, the gas can be supplied to the first major surface 11a side via the groove 14. For that reason, the gas can be easily supplied to broader area of the first major surface 11a. Since the dimension of the hole part 15c in the X-direction or the Y-direction is made larger than the dimension of the groove 14 in the X-direction or the Y-direction, the time when the gas passes through the hole 15c can be short. That is, while facilitating the gas flow, the arc discharge can be suppressed from being generated more effectively.

As described previously, an adhesion part 60 can be provided between the ceramic dielectric substrate 11 and the base plate 50. The dimension of the hole part 15c can be smaller than a dimension of the adhesion part 60 in the Z-direction. In this way, the joining strength between the ceramic dielectric substrate 11 and the base plate 50 can be improved. Since the dimension of the hole part 15c in the Z-direction is made smaller than the dimension of the adhesion part 60, while facilitating the gas flow, the arc discharge can be suppressed from being generated more effectively.

In this example, the first porous part 90 is provided in the hole part 15a. For this reason, an upper surface 90U of the first porous part 90 is not exposed to the first major surface. That is, the upper surface 90U of the first porous part 90 is positioned between the first major surface 11a and the second major surface 11b. On the other hand, a lower surface 90L of the first porous part 90 is exposed to the second major surface 11b.

The first porous part 90 includes a porous region 91 including multiple pores and a dense region 93 denser than the first porous part 90. The dense region 93 is a region having fewer pores than the porous region 91 or a region having substantially no pore. A porosity (percent: %) of the dense region 93 is lower than a porosity (%) of the first porous region 91. For that reason, a density (gram/cubic centimeter: $g/cm^3$) of the dense region 93 is higher than the density ($g/cm^3$) of the porous region 91. The dense region 93 is dense compared with the porous region 91, and thus for example, the rigidity (mechanical strength) of the dense region 93 is higher than the rigidity of the porous region 91.

The porosity of the dense region 93 is, for example, a ratio of a volume of space (pore) included in the dense region 93 to a total volume of the dense region 93. The porosity of the porous region 91 is, for example, a ratio of a volume (pore) included in the porous region 91 to a total volume of the porous region 91. For example, the porosity of the porous region 91 is not less than 5% and not more than 40%, favorably not less than 10% and not more than 30%, and the porosity of the dense region 93 is not less than 0% and not more than 5%.

The first porous part 90 is columnar (for example, cylindrical). The porous region 91 is columnar (for example, cylindrical). The dense region 93 contacts the porous region 91, or is continuous to the porous region 91. As shown in FIG. 2B, when viewed in the X-direction, the dense region 93 surrounds an outer circumference of the porous region 91. The dense region 93 surrounds a side surface 91s of the porous region 91 and tubular (for example cylindrical). In other words, the porous region 91 is provided to pierce the dense region 93 in the Z-direction. The gas flown in the through hole 15 from the gas introduction path 53 passes through multiple pores provided in the porous region 91 and is supplied to the groove 14.

The first porous part 90 including the porous region 91 like this is provided, and thus while securing the flow rate of the gas flowing through the through hole 15, the resistance to the arc discharge can be improved. The first porous part 90 includes the dense region 93, and thus the rigidity (mechanical strength) of the first porous part 90 can be improved.

For example, the first porous part 90 is integrated with the ceramic dielectric substrate 11. A state in which two members are integrated is a state in which the two members are chemically bonded by, for example, sintering or the like. A member (for example, adhesive) for fixing one member to the other member is not provided between the two members. That is, other member such as adhesive is not provided between the first porous part 90 and the ceramic dielectric substrate 11, and the first porous part 90 and the ceramic dielectric substrate 11 are integrated.

More specifically, in the state in which the first porous part 90 and the ceramic dielectric substrate 11 are integrated, the side surface (the side surface 93s of the dense region 93) of the first porous part 90 contacts an inner wall 15w of the through hole 15. The first porous part 90 is supported by the inner wall 15w with which the first porous part 90 is contact, and is fixed to the ceramic dielectric substrate 11.

For example, a through hole is provided in a base material serving as the ceramic dielectric substrate 11 before sintering, the first porous part 90 is fitted to the through hole. The ceramic dielectric substrate 11 (and the fitted first porous part 90) is sintered in this state, and thus the first porous part 90 and the ceramic dielectric substrate 11 can be integrated.

In this way, the first porous part 90 is integrated with the ceramic dielectric substrate 11, and thus fixed to the ceramic dielectric substrate 11. Thereby, in comparison with the case of fixing the first porous part 90 to the ceramic dielectric substrate 11 by the adhesive or the like, the strength of the electrostatic chuck 110 can be improved. For example, degradation of the electrostatic chuck due corrosion or erosion of the adhesive does not occur.

In the case where the first porous part 90 and the ceramic dielectric substrate 11 are integrated, a force is applied to the side surface of outer circumference of the first porous part 90 from the ceramic dielectric substrate 11. On the other hand, in the case where multiple pores are provided in the first porous part 90 in order to secure the flow rate of the gas, the mechanical strength of the first porous part 90 is reduced. For this reason, there is fear that the first porous part 90 is damaged by the force applied from the ceramic dielectric substrate 11 to the first porous part 90 when integrating the first porous part 90 with the ceramic dielectric substrate 11.

On the contrary, the first porous part 90 includes the dense region 93, and thus the rigidity (mechanical strength) of the first porous part 90 can be improved and the first porous part 90 and the ceramic dielectric substrate 11 can be integrated.

In the embodiment, the first porous part 90 may not necessarily be integrated with the ceramic dielectric substrate 11. For example, as shown in FIG. 12, the first porous part 90 may be attached to the ceramic dielectric substrate 11 by using the adhesive.

The dense region 93 is positioned between the inner wall 15w forming the through hole 15 of the ceramic dielectric substrate 11 and the porous region 91. That is, the porous region 91 is provided inside the first porous part 90, and the dense region 93 is provided outside. The dense region 93 is provided outside the first porous part 90, and thus the rigidity to the force applied from the ceramic dielectric substrate to the first porous part 90 can be improved. Thereby, the first porous part 90 and the ceramic dielectric substrate 11 can be easily integrated. For example, in the case where an adhesive member 61 (see FIG. 12) is provided between the first porous part 90 and the ceramic dielectric substrate 11, the gas passing through the first porous part 90 can be suppressed by the dense region 93 from contacting the adhesive member 61. Thereby, the degradation of the adhesive member 61 can be suppressed. The porous region 91 is provided inside the first porous part 90, and thus the through hole 15 of the ceramic dielectric substrate 11 can be suppressed from being closed up by the dense region 93 and the flow rate of the gas can be secured.

A thickness of the dense region 93 (a length L0 between the side surface 91s of the porous region 91 and the side surface 93s of the dense region 93) is, for example, not less than 100 μm and not more than 1000 μm.

An insulative ceramic is used for a material of the first porous part 90. The first porous part 90 (each of the porous region 91 and the dense region 93) includes at least one of aluminum oxide ($Al_2O_3$), titanium oxide ($TiO_2$) or yttrium oxide ($Y_2O_3$). Thereby, the high breakdown voltage and the high rigidity of the first porous part 90 can be obtained.

For example, the first porous part 90 includes one of aluminum oxide, titanium oxide and yttrium oxide as a main component.

In this case, a purity of the aluminum oxide of the ceramic dielectric substrate 11 can be higher than a purity of the aluminum oxide of the first porous part 90. In this way, the performance of the resistance to plasma or the like of the electrostatic chuck 110 can be secured, and the mechanical strength of the first porous part 90 can be secured. As one example, sintering of the first porous part 90 is assisted by including a fine amount of additive to the first porous part 90, and it is possible to secure the control of the pore and to secure the mechanical strength.

In the specification, a ceramic purity such as aluminum oxide of the ceramic dielectric substrate 11 can be measured by a fluorescent X-ray analysis, ICP-AES method (Inductive Coupled Plasma-Atomic Emission Spectrometry: high-frequency inductively coupled plasma emission spectrometric analysis method) or the like.

For example, a material of the porous region 91 is the same as a material of the dense region 93. However, the material of the porous region 911 may be different from the material of the dense region 93. A composition of the material of the porous region 91 may be different from a composition of the material of the dense region 93.

As shown in FIG. 2A, a distance D1 in the X-direction or the Y-direction between the porous region 91 (multiple sparse regions 94 described later) and the electrode 12 is longer than a distance D2 in the Z-direction between the first major surface 11a and the electrode 12. The discharge in the first porous part 90 can be suppressed by lengthen the distance D1 in the X-direction or the Y-direction between the porous region 91 provided in the first porous part 90 and the electrode 12. The suction force of the object W placed on the first major surface 11a can be increased by shortening the distance D2 in the Z-direction between the first major surface 11a and the electrode 12.

Figure 3A:
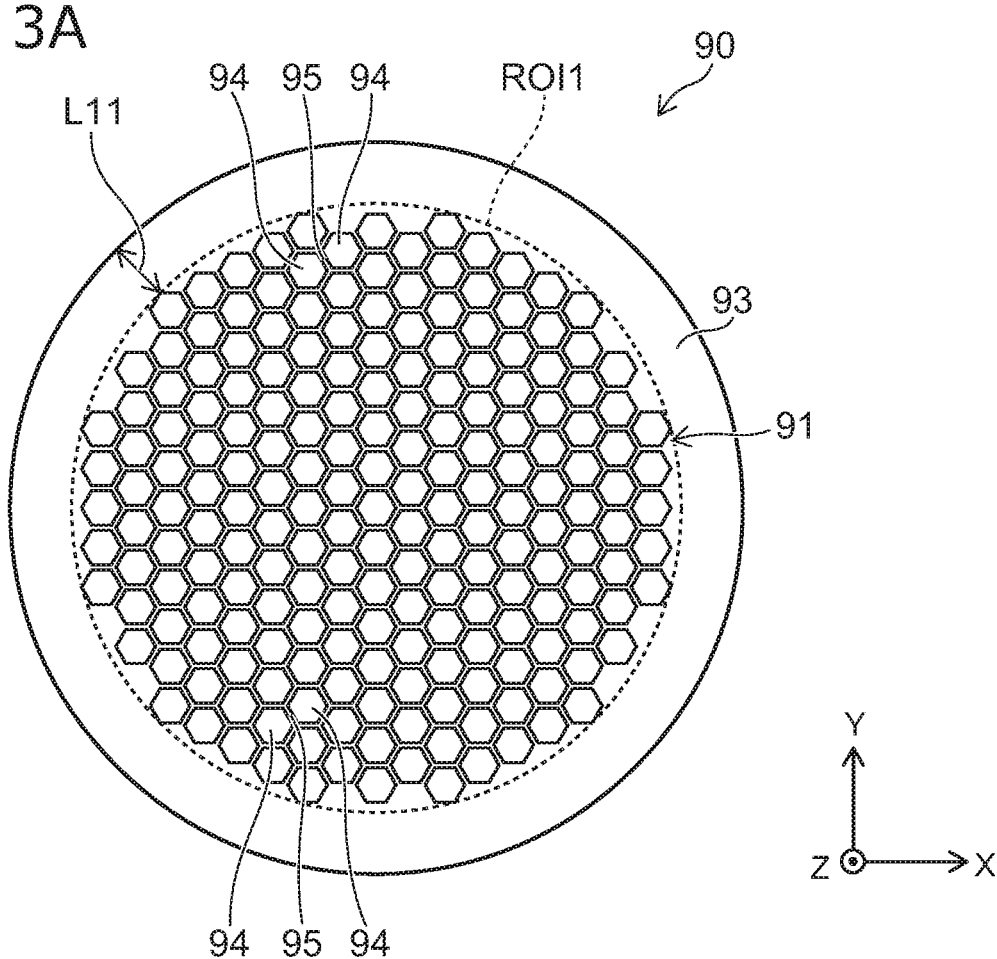
FIG. 3A and FIG. 3B are schematic views illustrating a first porous part of the electrostatic chuck according to the embodiment.
Figure 3B:
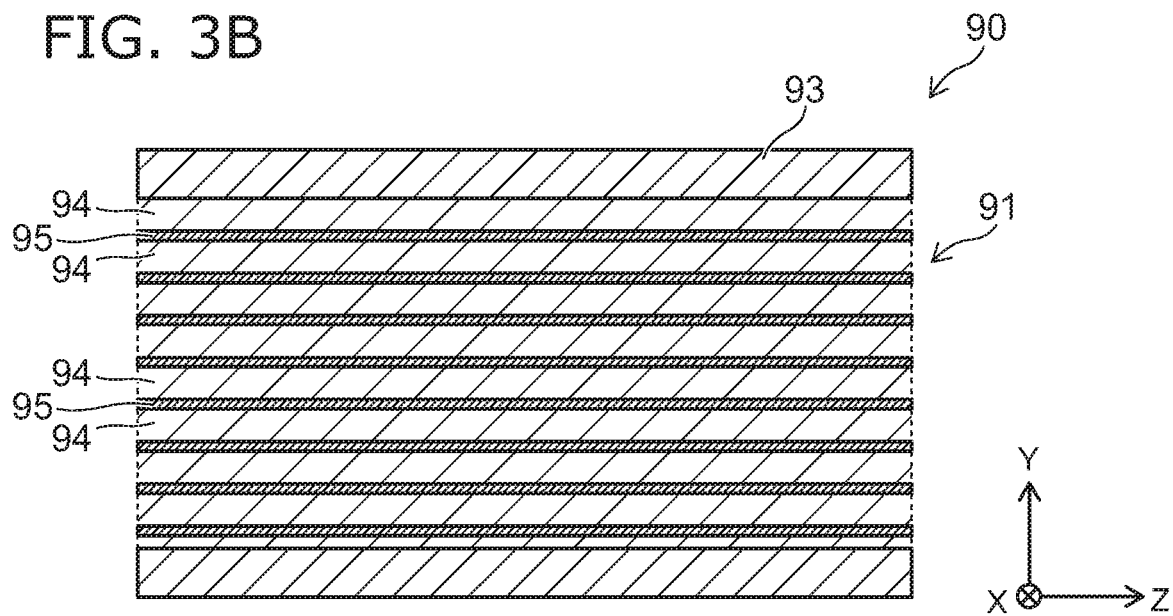

FIG. 3A and FIG. 3B are schematic views illustrating the first porous part of the electrostatic chuck according to the embodiment.

FIG. 3A is a plan view of the first porous part 90 viewed along the Z-direction, and FIG. 3B is a cross sectional view in a ZY plane of the first porous part 90.

As shown in FIG. 3A and FIG. 3B, in this example, the porous region 91 includes multiple sparse portions and a dense portion 95. Each of the sparse portions 94 includes multiple pores. The dense portion 95 is denser than the sparse portions 94. That is, the dense portion 95 is a portion with a fewer pores than the sparse portions 94, or a portion with substantially no pore. A porosity of the sparse portions 95 is lower than a porosity of the dense portion 94. For that reason, the density of the dense portion 95 is higher than the density of the sparse portions 94. The porosity of the dense portion 95 may be the same as the porosity of the dense region 93. Since the dense portion 95 is dense compared with the sparse portions 94, the rigidity of the dense portion 95 is higher than the rigidity od the sparse portions 94.

The porosity of one sparse portion 94 is, for example, a ratio of the space (pore) included in the sparse portion 94 to the whole volume of the sparse portion 94. The porosity of the dense portion 95 is, for example, a ratio of the volume of the space (pore) included in the dense portion 95 to the whole volume of the dense portion 95. For example, the porosity of the sparse portion 94 is not less than 20% and not more than 60%, favorably not less than 30% and not more than 50%, and the porosity of the dense portion 95 is not less than 0% and not more than 5%.

Each of the multiple sparse portions 94 extends in the Z-direction. For example, each of the multiple sparse portions 94 is columnar (cylindrical or polygonal columnar), and is provided to pierce the porous region 91 in the Z-direction. The dense portion 95 is positioned between the multiple sparse portions 94. The dense portion 95 is wall-shaped and partitions the sparse portions 94 which are mutually adjacent. As shown in FIG. 3A, the dense portion 95 is provided to surround the outer circumference of each of the multiple sparse portions 94. The dense portion 95 is continuous to the dense region 93 in the outer circumference of the porous region 91.

The number of the sparse portions 94 provided in the porous region 91 is not less than 50 and not more than 1000. As shown in FIG. 3A, when viewed along the Z-direction, the multiple sparse portions 94 have substantially the same size. For example, when viewed along the Z-direction, the multiple sparse portions 94 are dispersed isotopically and uniformly in the porous region 91. For example, distances between the adjacent sparse portions 94 (namely, a thickness of the dense portion 95) are substantially constant.

For example, when viewed along the Z-direction, a distance L11 between the side surface 93s of the dense region 93 and the sparse portion 94 closest to the side surface 93s of the multiple sparse portions 94 is not less than 100 μm and not more than 1000 μm.

In this way, the multiple sparse portions 94 and the dense portion 95 which is denser than the sparse portions 94 are provided in the porous region 91, and thereby, in comparison with the case where multiple pores are dispersed three dimensionally and randomly in the porous region, while securing the resistance to the arc discharge and the flow rate of the gas flowing through the through hole 15, the rigidity of the first porous part 90 can be improved.

For example, if the porosity of the porous region increases, the flow rate of the gas increases, however the resistance to the arc discharge and the rigidity are decreased. On the contrary, even if the porosity is large, the resistance to the arc discharge and the rigidity can be suppressed from decreasing by providing the dense portion 95.

For example, when viewed along the Z-direction, a minimum circle, an ellipse or a polygon including all of the multiple sparse portions 94 are supposed. It can be conceived that the inside of the circle, ellipse or polygon is the porous region 91 and the outside of the circle, ellipse or polygon is the dense region 93.

As described above, the first porous part 90 can include the multiple sparse portions 94 including multiple pores 96 including a first pore and a second pore, and the dense portion 95 having a density higher the a density of the sparse portions 94. Each of the multiple sparse portions 94 extends in the Z-direction. The dense portion 95 is positioned between the multiple sparse portions 94. The sparse portions 94 includes a wall portion 97 provided between the pore 96 (first pore) and the pore 96 (second pore). The minimum value of a dimension of the wall portion 97 can be smaller than the minimum value of a dimension of the dense portion 95 in the X-direction or the Y-direction. In this way, since the sparse portions 94 and the dense portion 95 which extend in the Z-direction are provided in the first porous part 90, while securing the resistance to the arc discharge and the gas flow rate, the mechanical strength (rigidity) of the first porous part 90 can be improved.

A dimension of the multiple pore 96 provided in each of the multiple sparse portions 94 can be smaller than the dimension of the dense portion 95 in the X-direction or the Y-direction. In this way, since the dimension of the multiple pores 96 can be sufficiently small, the resistance to the arc discharge can be further improved.

A ratio of vertical/side (aspect ratio) of the multiple pores 96 provided in each of the multiple sparse portions 94 can be not less than 30 and not more than 10000. In this way, the resistance to the arc discharge can be further improved. More favorably, a lower limit of the ratio of vertical/side (aspect ratio) of the multiple pores 96 is not less than 100 and an upper limit is not more than 1600.

In the X-direction or the Y-direction, the dimension of the multiple pores 96 provided in each of the multiple sparse portions 94 can be not less than 1 micro meter and not less than 20 micro meters. In this way, since the pores 96 having the dimension of 1 to 20 micro meters and extending in one direction can be arranged, the high resistance to the arc discharge can be realized.

Figure 6A:
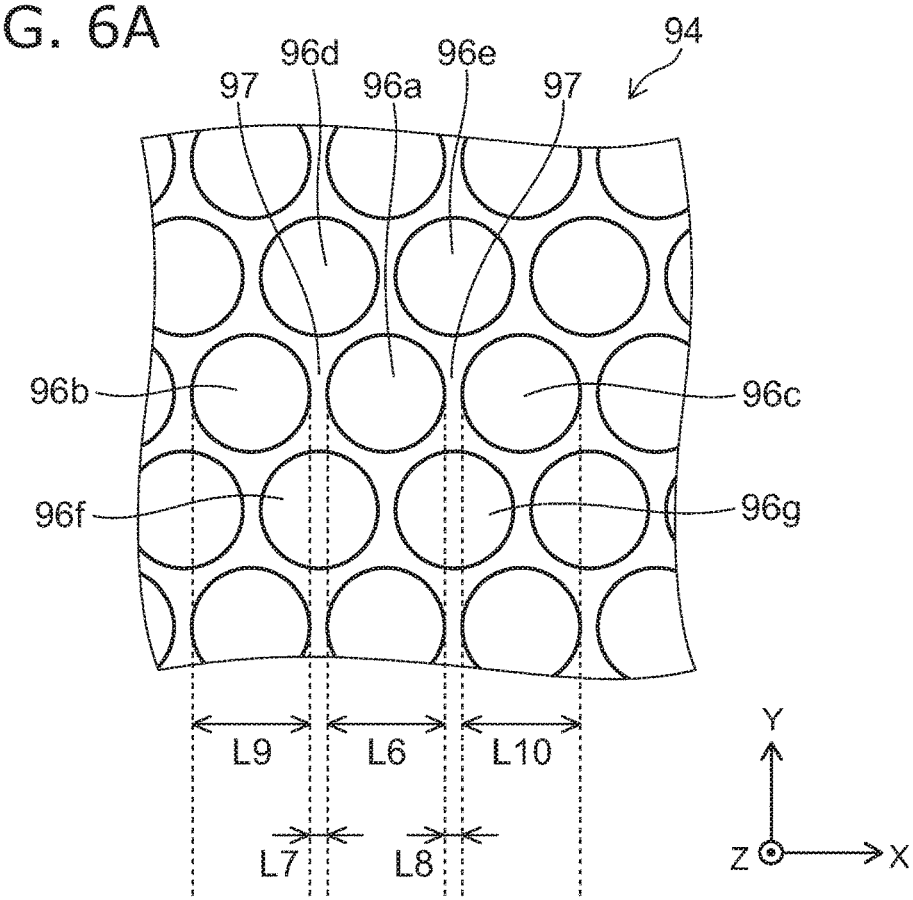
FIG. 6A and FIG. 6B are schematic plan views illustrating the first porous part of the electrostatic chuck according to the embodiment.
Figure 6B:
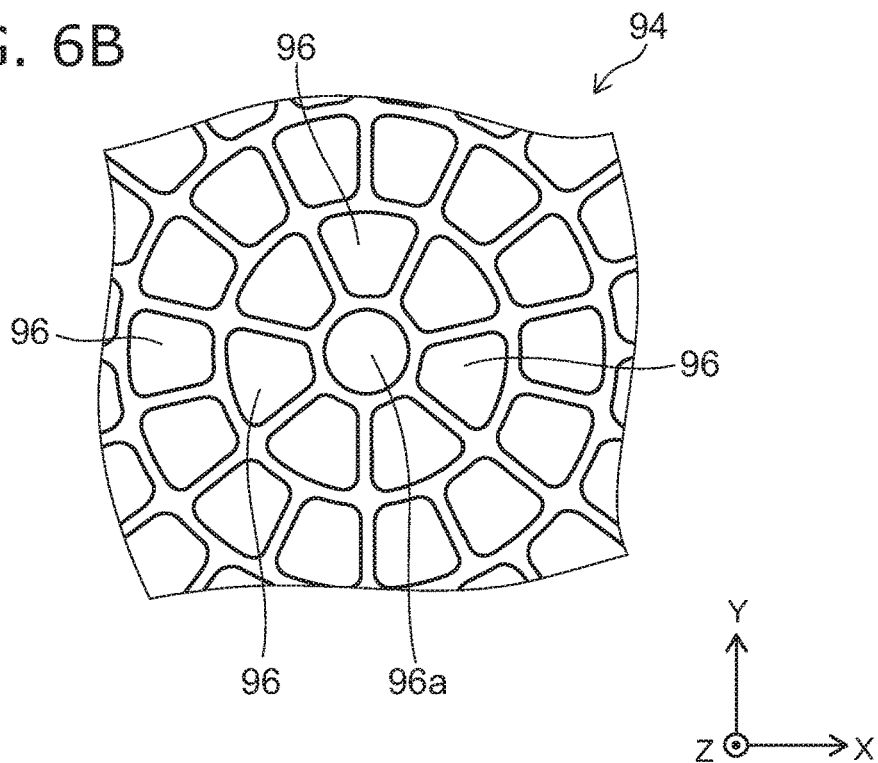

As shown in FIG. 6A and FIG. 6B described later, when viewed along the Z-direction, the first pore 96a is positioned at a center portion of the sparse portion 94, and the number of pores 96b to 96g adjacent to the first pore 96a and surrounding the first pore 96a of the multiple holes 96 can be 6. In this way, in a plan view, it is possible to dispose the multiple pores 96 with high isotropy and high density. Thereby, while securing the resistance to the arc discharge and the flow rate of the flowing gas, the rigidity of the first porous part 90 can be improved.

Figure 4:
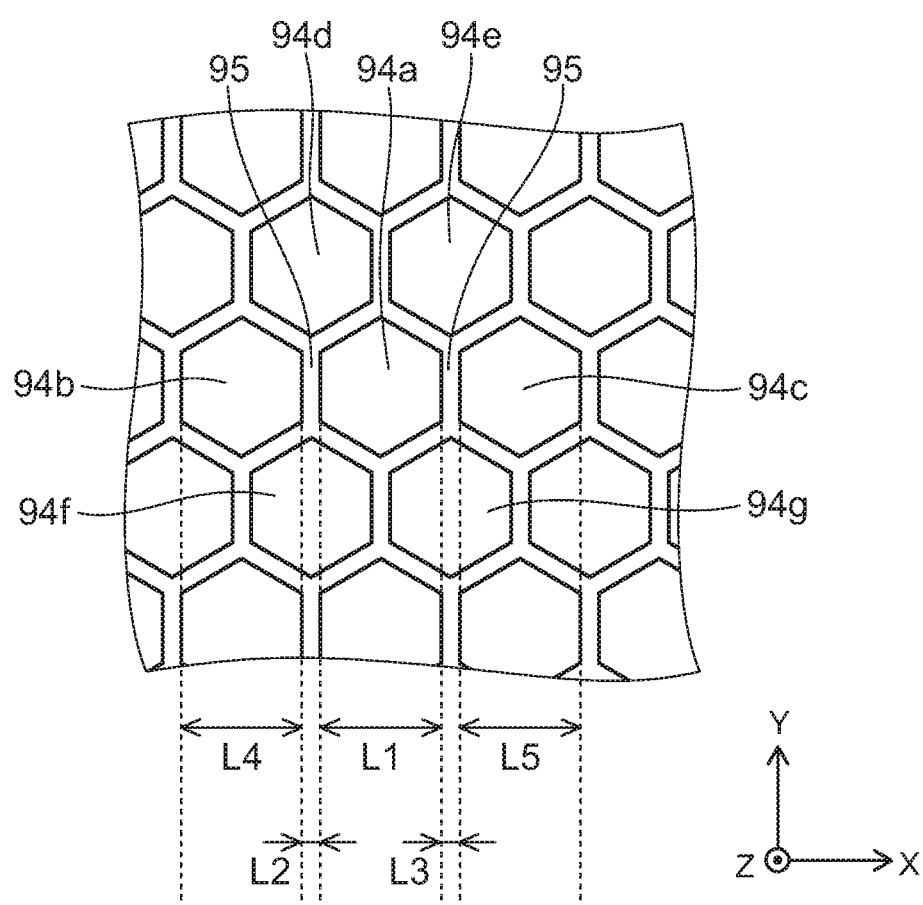
FIG. 4 is a schematic plan view illustrating the first porous part of the electrostatic chuck according to the embodiment.

FIG. 4 is a schematic plan view illustrating the first porous part of the electrostatic chuck according to the embodiment.

FIG. 4 shows a portion of the first porous part 90 as viewed along the Z-direction, and corresponds to an enlarged view of FIG. 3A.

When viewed along the Z-direction, each of the multiple sparse portions 94 is substantially hexagon (substantially regular hexagon). When viewed along the Z-direction, the multiple sparse portions 94 includes a first sparse portion 94a positioned at the center of the porous region 91 and six sparse portions 94 (second to seventh sparse portions 94b to 94g) surrounding the first sparse portion 94a.

The second to seventh sparse portions 94b to 94g are adjacent to the first sparse portion 94a. The second to seventh sparse portions 94b to 94g are the sparse portions 94 closest to the first sparse portion 94a of the multiple sparse portions 94.

The second sparse portion 94b and the third sparse portion 94c are arranged with the first sparse portion 94a in the X-direction. That is, the first sparse portion 94a is positioned between the second sparse portion 94b and the third sparse portion 94c.

A length L1 (a diameter of the first sparse portion 94a) along the X-direction of the first sparse portion 94a is longer than a length L2 along the X-direction between the first sparse portion 94a and the second sparse portion 94b, and is longer than a length L3 along the X-direction between the first sparse portion 94a and the third sparse portion 94c.

Each of the length L2 and the length L3 corresponds to the thickness of the dense portion 95. That is, the length L2 is a length along the X-direction of the dense portion 95 between the first sparse portion 94a and the second sparse portion 94b. The length L3 is a length along the X-direction of the dense portion 95 between the first sparse portion 94a and the third sparse portion 94c. The length L2 and the length L3 are substantially the same. For example, the length L2 is not less than 0.5 times and not more than 2.0 times of the length L3.

The length L1 is substantially the same as a length L4 (a diameter of the second sparse portion 94b) along the X-direction of the second sparse portion 94b, and substantially the same as a length L5 (a diameter of the third sparse portion 94c) along the X-direction of the third sparse portion 94c. For example, each of the length L4 and the length L5 is not less than 0.5 times and not more than 2.0 times of the length L1.

In this way, the first sparse portion 94a is adjacent to six parse portions 94 of the multiple sparse portions 94 and is surrounded. That is, when viewed along the Z-direction, the number of the sparse portions 94 adjacent to one sparse portion 94 at the center of the porous region 91 is 6. Thereby, in a plan view, it is possible to dispose the multiple sparse portions 94 with high isotropy and high density. Thereby, while securing the resistance to the arc discharge and the flow rate of the gas flowing through the through hole 15, the rigidity of the first porous part 90 can be improved. Variation of the rigidity to the arc discharge, variation of the flow rate of the gas flowing through the through hole 15, and variation of the rigidity of the first porous part 90 can be suppressed.

The diameter of the sparse portions 94 (the length L1, L4, or length L5 or the like) is, for example, not less than 50 μm and not more than 500 μm. The thickness (the length L2 or L3 or the like) of the dense portion 95 is, for example, not less than 10 μm and not more than 100 μm. The diameter of the sparse portions 94 is larger than the thickness of the dense portion 95. The thickness of the dense portion 95 is thinner than the thickness of the dense region 93.

Figure 5:
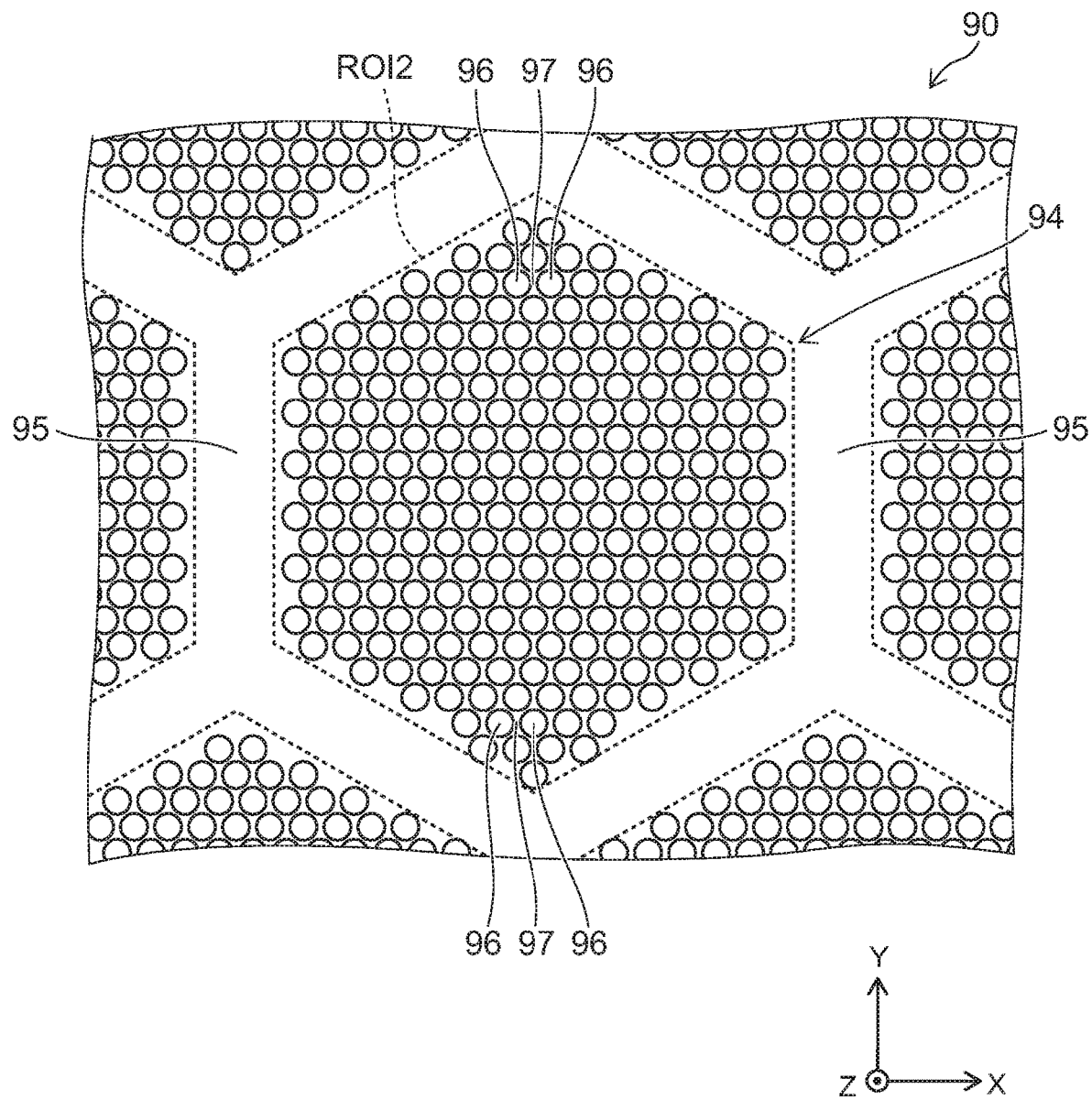
FIG. 5 is a schematic plan view illustrating the first porous part of the electrostatic chuck according to the embodiment.

FIG. 5 is a schematic plan view illustrating the first porous part of the electrostatic chuck according to the embodiment.

FIG. 5 shows a portion of the first porous part 90 as viewed along the z-direction. FIG. 5 is an enlarged view around one sparse portion 94.

As shown in FIG. 5, in this example, the sparse portions 94 include the multiple pores 96 and the wall portion 97 provided between the multiple pores 96.

Each of the multiple pores 96 extends in the Z-direction. Each of the multiple pores 96 is capillary-shaped (one-dimensional capillary structure), and pierces the sparse portions 94 in the Z-direction. The wall portion 97 is wall-shaped and partitions the pores 96 which are mutually adjacent. As shown in FIG. 5, when viewed along the Z-direction, the wall portion 97 is provided to surround the outer circumference of each of the multiple pores 96. The wall portion 97 is continuous to the dense portion 95 in the outer circumference of the sparse portion 94.

The number of the pores 96 provided in one sparse portion 94 is not less than 50 and not more than 1000. As shown in FIG. 5, when viewed along the Z-direction, the multiple pores 96 have substantially the same size. For example, when viewed along the Z-direction, the multiple pores 96 are dispersed isotopically and uniformly in the sparse portion 94. For example, distances between the adjacent pores 96 (namely, a thickness of the wall portion 97) are substantially constant.

In this way, since the pores 96 extending in one direction are arranged in the sparse portion 94, in comparison with the case where multiple pores are dispersed three dimensionally and randomly in the sparse portions, the high rigidity to the arc discharge can be realized with small variation.

Here, "capillary structure" of the multiple pores 96 will be further described.

Recently, reduction of circuit line width and miniaturization of circuit pitch for high integration of semiconductors have been further proceeding. A further high power is applied to the electrostatic chuck, and the temperature control of the suction object is required at a higher level. From this background, it is required that while suppressing the arc discharge certainly even under a high power environment, the gas flow rate is secured sufficiently and the flow rate is controlled with high accuracy. In the electrostatic chuck 110 according to the embodiment, a ceramic plug (the first porous part 90) has been provided for prevention of the arc discharge in the helium supply hole (the gas introduction path 53), and then the pore diameter (the diameter of the pore 96) is made small to, for example, a level of a few to a few tens of µm (the detail of the diameter of the pore 96 will be described later). If the diameter becomes small to this level, control of gas flow rate may be difficult. Then, in the invention, for example, the shape of the pore 96 is further devised to be along the Z-direction. Specifically, the flow rate has been secured by a relatively large pore, and its shape is made complex three dimensionally, and thus the prevention of the arc discharge has been achieved. On the other hand, in the invention, the prevention of the arc discharge is achieved by reduction of the diameter of the pore 96 to, for example, a level of a few to a few tens of µm, and the flow rate is secured by simplifying the shape on the contrary. That is, the invention has been made on the basis of the idea completely different from the conventional idea.

The shape of the sparse portions 94 is not limited to a hexagon, but may be a circle (or ellipse) and other polygon. For example, when viewed along the Z-direction, a minimum circle, an ellipse or a polygon including all of the multiple pores 96 arranged with an interval not more than 10 µm are supposed. It can be conceived that the inside of the circle, ellipse or polygon is the sparse portions 94 and the outside of the circle, ellipse or polygon is the dense portion 95.

FIG. 6A and FIG. 6B are schematic plan views illustrating the first porous part of the electrostatic chuck according to the embodiment.

FIG. 6A and FIG. 6B show a portion of the fits porous part 90 as viewed along the Z-direction, and are enlarged views showing the pores 96 in one sparse portion.

As shown in FIG. 6A, when viewed along the Z-direction, the multiple pores 96 include the first pore 96a positioned at the center portion of the sparse portion of the sparse portion 94, six pores 96 (the second to seventh pores 96b to 96g) surrounding the first pore 96a. The second to seventh pores 96b to 96g are adjacent to the first pore 96a. The second to seventh pores 96b to 96g are the pore 96 closest to the first pore 96a of the multiple pores 96.

The second pore 96b and the third pore 96c are arranged with the first pore 96a in the X-direction. That is, the first pore 96a is positioned between the second pore 96b and the third pore 96c.

For example, a length L6 (a diameter of the first pore 96a) along the X-direction of the first pore 96a is longer than a length L7 along the X-direction between the first pore 96a and the second pore 96b, and is longer than a length L8 along the X-direction between the first pore 96a and the third pore 96c.

Each of the length L7 and the length L8 corresponds to the thickness of the wall portion 97. That is, the length L7 is a length along the X-direction of the wall portion 97 between the first pore 96a and the second pore 97b. The length L8 is a length along the X-direction of the wall portion 97 between the first pore 96a and the third pore 96c. The length L7 and the length L8 are substantially the same. For example, the length L7 is not less than 0.5 times and not more than 2.0 times of the length L8. The length L6 is substantially the same as a length L9 (a diameter of the second pore 96b) along the X-direction of the second pore 96b, and substantially the same as a length L10 (a diameter of the third pore 97c) along the X-direction of the third pore 96c. For example, each of the length L9 and the length L10 is not less than 0.5 times and not more than 2.0 times of the length L6.

For example, if the diameter of the pore is small, the resistance to the arc discharge and the rigidity are improved. On the other hand, if the diameter of the pore is large, the gas flow rate can be large. The diameter of the pore 96 (the length L6, L9, or L10 or the like) is, for example, not less than 1 micro meter (µm) and not more than 20 µm. Since the pores having the diameter of 1 to 20 µm and extending in one direction can be arranged, the high resistance to the arc discharge can be realized with a small variation. The diameter of the pore 96 is more favorably not less than 3 µm and not more than 10 µm.

Here, a measuring method of the diameter of the pores 96 will be described. An image is obtained with magnification of not less than 1000 times by using a scanning electron microscopy (for example, Hitachi High Technologies, S-3000). Equivalent circular diameters of 100 pieces for the pores 96 are calculated by using a commercially available image analysis software, and the average value is taken as the diameter of the pores 96.

It is further favorable to suppress the variation of the diameters of the multiple pores 96. It is possible to control precisely the flow rate of the flowing gas and the breakdown voltage by making the variation of the diameters small. A cumulative distribution of 100 pieces equivalent circular diameters obtained in the calculation of the above diameters of the pores 96 can be used as the variation of the diameters of the multiple pores 96. Specifically, the concept of the particle diameter D50 (median diameter) at 50 vol % of the cumulative distribution and the particle diameter D90 at 90 vol % used generally for the particle size distribution measurement is applied, and the cumulative distribution graph of the pores 96 taking the horizontal axis as a pore diameter (µm) and taking the vertical axis as a relative pore volume (%) is used, and then the pore diameter (corresponding to D50 diameter) at 50 vol % of the cumulative distribution and the pore diameter (corresponding to D90 diameter) at 90 vol % of the cumulative distribution are found. It is favorable that the variation of the diameters of the multiple pores 96 is suppressed to a level satisfying the relationship of D50:D90≤1:2.

The thickness of the wall portion 97 (the length L7, L8 or the like) is, for example, not less than 1 μm and not more than 10 μm. The thickness of the wall portion 97 is thinner than the thickness of the dense portion 95.

In this way, the first pore 96a is adjacent to six pores 96 of the multiple pores 96 and surrounded. That is, when viewed along the Z-direction, the number of the pores 96 adjacent to one pore 96 at the center portion of the sparse portion 94 is 6. Thereby, in a plan view, it is possible to dispose the multiple pores 96 with high isotropy and high density. Thereby, while securing the resistance to the arc discharge and the flow rate of the gas flowing through the through hole 15, the rigidity of the first porous part 90 can be improved. The variation of the resistance of the arc discharge, the variation of the flow rate of the gas flowing through the through hole 15, and the variation of the rigidity of the first porous part 90 can be suppressed.

FIG. 6B shows another example of disposition of the multiple pores 96 in the sparse portion 94. As shown in FIG. 6B, in this example, the multiple pores 96 are concentrically disposed around the center of the first pore 96a. Thereby, in a plan view, it is possible to dispose the multiple pores with high isotropy and high density.

The first porous part 90 with the structure as described above can be manufactured, for example, by using extrusion molding. Each of the lengths L0 to L10 can be measured by the observation using a microscopy such as a scanning electron microscopy.

Evaluation of the porosity in the specification will be described. Here, the evaluation of the porosity of the first porous part 90 will be described as an example.

The image as shown in FIG. 3A is obtained, and a ratio R1 of the multiple sparse portions 94 to the porous region 91 is calculated by an image analysis. A scanning electron microscopy (for example, Hitachi High Technologies, S-3000) is used for obtaining the image. A BSE image is obtained at an acceleration voltage of 15 kV and with a magnification of 30 times. For example, an image size is 1280×960 pixels, and an image gradation is 256 gradations.

An image analysis software (for example, Win-ROOF Ver6.5 (Mitsuya Shouji)) is used for calculation of the ratio R1 of the multiple sparse portions 94 to the porous region 91.

The calculation of the ratio R1 based on Win-ROOF Ver6.5 can be made as follows.

An evaluation area ROI1 (see FIG. 3A) is assumed to be the minimum circle (or ellipse) including all sparse portions 94.

Binarization processing by a single threshold (for example, 0) is performed and an area S1 of the evaluation area ROI1 is calculated.

Binarization processing by two thresholds (for example, 0 and 36) is performed and a total area S2 of the multiple sparse portions 94 in the evaluation are ROI1 is calculated. At this time, fill-in process in the sparse portions 94 and deletion of regions with a small area which is considered to be noise (threshold: not more than 0.002) are performed. The two thresholds are appropriately adjusted by brightness and contrast of the image.

The ratio R1 is calculated as a ratio of the area S2 to the area S1. That is, the ratio R1 (%)=(area S2)/(area S1)×100.

In the embodiment, the ratio R1 of the multiple sparse portions 94 to the porous region 91 is, for example, not less than 40% and not more than 70%, favorably not less than 50% and not more than 70%. The ratio R1 is, for example, about 60%.

The image as shown in a plan view of FIG. 5 is obtained, and a ratio R2 of the multiple pores 96 to the sparse portion 94 is calculated by the image analysis. The ratio R2 corresponds to, for example, the porosity of the sparse portion 94. A scanning electron microscopy (for example, Hitachi High Technologies, S-3000) is used for obtaining the image. A BSE image is obtained at an acceleration voltage of 15 kV and with a magnification of 600 times. For example, an image size is 1280×960 pixels, and an image gradation is 256 gradations.

An image analysis software (for example, Win-ROOF Ver6.5 (Mitsuya Shouji)) is used for calculation of the ratio R2 of the multiple pores 96 to the sparse portion 94.

The calculation of the ratio R2 based on Win-ROOF Ver6.5 can be made as follows.

An evaluation area ROI2 (see FIG. 5) is assumed to be a hexagon to approximate the shape of the sparse portion 94. All pores 96 provided in the sparse portion 94 are included in the evaluation area ROI2.

Binarization processing by a single threshold (for example, 0) is performed and an area S3 of the evaluation area ROI2 is calculated.

Binarization processing by two thresholds (for example, 0 and 36) is performed and a total area S4 of the multiple pores 96 in the evaluation are ROI2 is calculated. At this time, fill-in process in the pores 96 and deletion of regions with a small area which is considered to be noise (threshold: not more than 1) are performed. The two thresholds are appropriately adjusted by brightness and contrast of the image.

The ratio R2 is calculated as a ratio of the area S4 to the area S3. That is, the ratio R2 (%)=(area S4)/(area S3)×100.

In the embodiment, the ratio R2 of the multiple pores 96 to the sparse portion 94 (the porosity of the sparse portion 94) is, for example, not less than 20% and not more than 60%, favorably not less than 30% and not more than 50%. The ratio R2 is, for example, about 40%.

The porosity of the porous region 91 corresponds to, for example, a product of the ratio R1 of the multiple sparse portions 94 to the porous region 91 and the ratio R2 of the multiple pores 96 to the sparse portion 94. For example, when the ratio R1 is 60% and the ratio R2 is 40%, the porosity of the porous region 91 can be calculated to be about 24%.

The first porous part 90 including the porous region 91 having this porosity is used, and thus while securing the flow rate of the gas flowing through the through hole 15, the breakdown voltage can be improved.

Similarly, porosities of the ceramic dielectric substrate 11 and a second porous part 70 can be calculated. The magnification of the electron scanning microscopy is favorable to be appropriately selected in a range, for example, a few ten times to a few thousand times depending on the observation object.

Figure 7A:
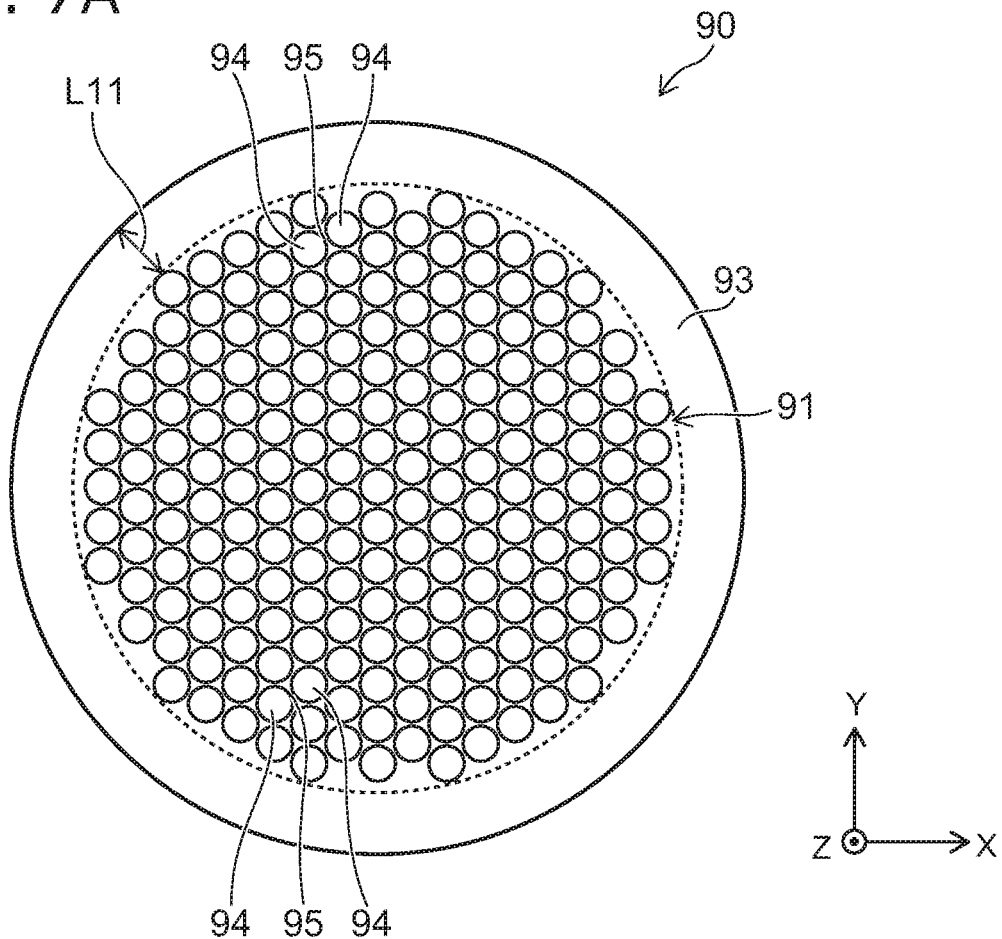
FIG. 7A and FIG. 7B are schematic views illustrating another first porous part according to the embodiment.
Figure 7B:
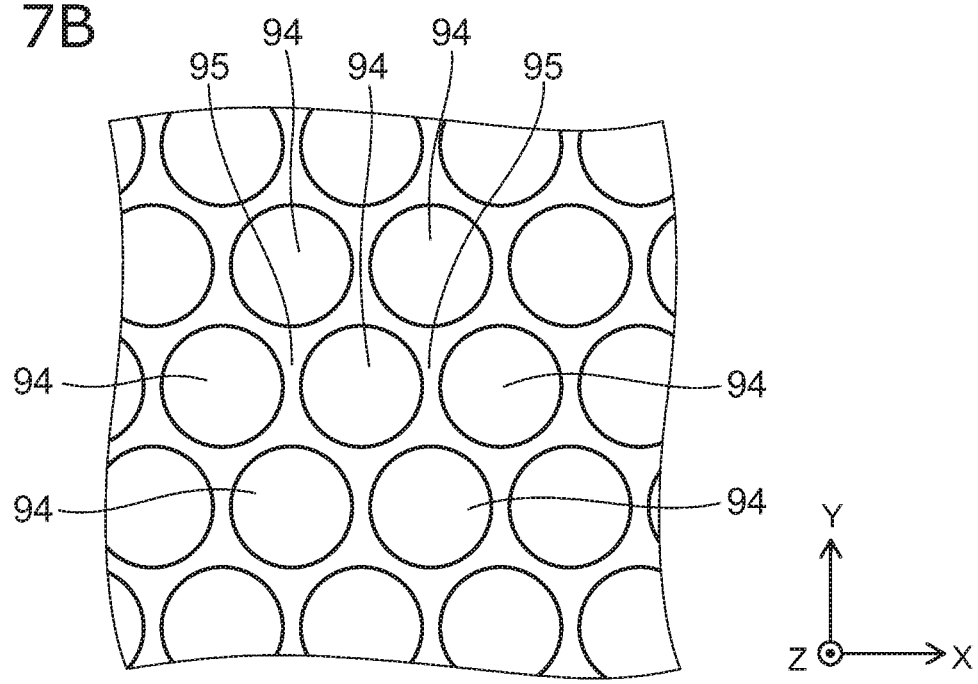

FIG. 7A and FIG. 7B are schematic views illustrating another first porous part according to the embodiment.

FIG. 7A is a plan view of the first porous part 90 as viewed along the Z-direction, and FIG. 7B corresponds to an enlarged view of a portion of FIG. 7A.

As shown in FIG. 7A and FIG. 7B, in this example, a planar shape of the sparse portions 94 is circular. In this way, the planar shape of the sparse portions 94 may not be hexagonal.

Figure 8:
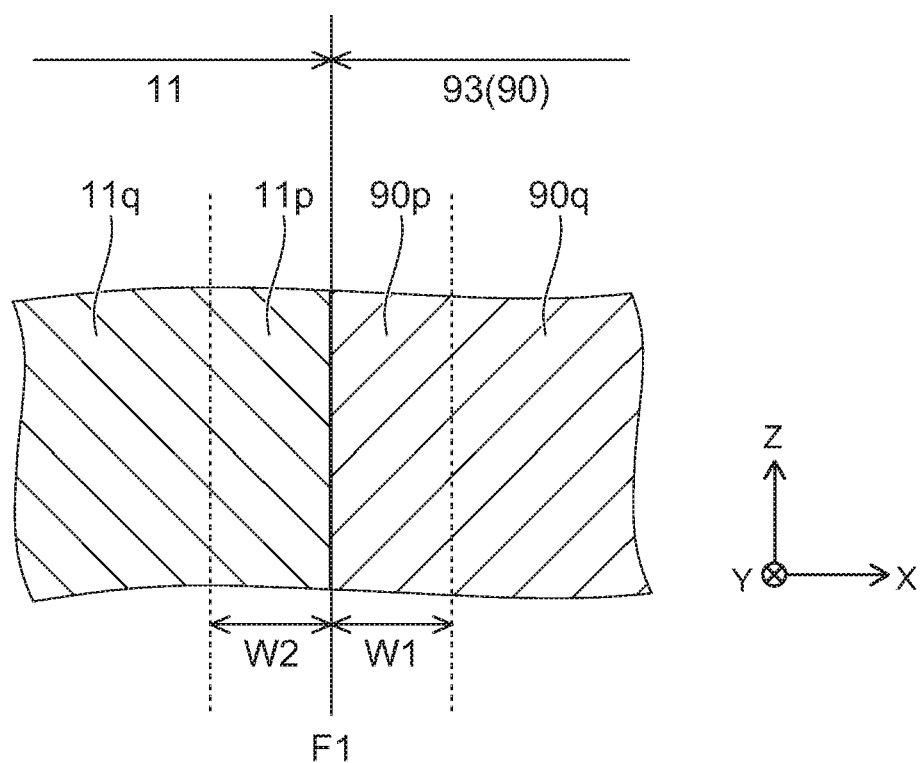
FIG. 8 is a schematic cross sectional view illustrating the electrostatic chuck according to the embodiment.

FIG. 8 is a schematic cross sectional view illustrating the electrostatic chuck according to the embodiment.

FIG. 8 corresponds to an enlarged view of the region B shown in FIG. 2. That is, FIG. 8 shows near an interface F1 between the first porous part 90 (the dense region 93) and the ceramic dielectric substrate 11. In this example, aluminum oxide is used for materials of the first porous part 90 and the ceramic dielectric substrate 11.

As shown in FIG. 8, the first porous part 90 includes a first region 90p positioned on the ceramic dielectric substrate 11 side in the X-direction or the Y-direction and a second region 90q continuous to the first region 90p in the X-direction or the Y-direction. The first region 90p and the second region 90q are portions of the dense region 93 of the first porous part 90.

The first region 90p is positioned between the second region 90q and the ceramic dielectric substrate 11 in the X-direction or the Y-direction. The first region 90p is a region of about 40 to 60 μm from the interface F1 in the X-direction or the Y-direction. That is, a width W1 (a length of the first region 90p in a direction perpendicular to the interface F1) along the X-direction or the Y-direction of the first region 90p is, for example, not less than 40 μm and not more than 60 μm.

The ceramic dielectric substrate 11 includes a first substrate region 11p positioned on the first porous part 90 (the first region 90p) side in the X-direction or the Y-direction and a second substrate region 11q continuous to the first substrate region 11p in the X-direction or the Y-direction. The first region 90p and the first substrate region 11p are provided to contact. The first substrate region 11p is positioned between the second substrate region 11q and the first porous part 90 in the X-direction or the Y-direction. The first substrate region 11p is a region of about 40 to 60 μm from the interface F1 in the X-direction or the Y-direction. That is, a width W2 (a length of the first substrate region 11p along the direction perpendicular to the interface F1) is, for example, not less than 40 μm and not more than 60 μm.

Figure 9A:
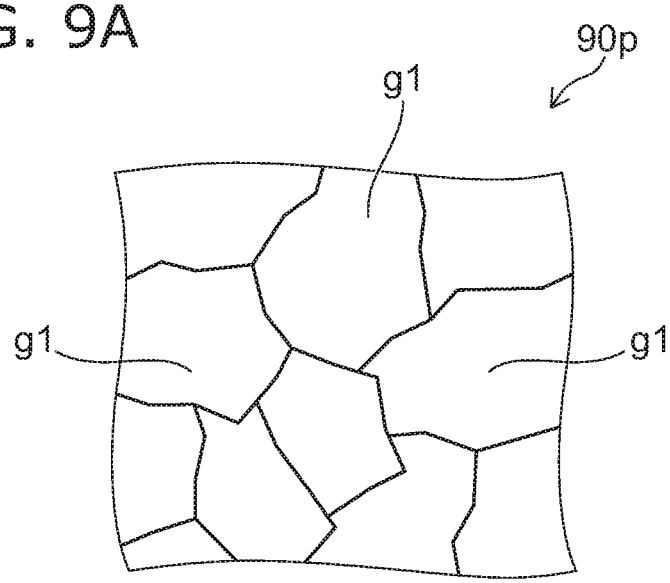
FIG. 9A and FIG. 9B are schematic cross sectional views illustrating the electrostatic chuck according to the embodiment.
Figure 9B:
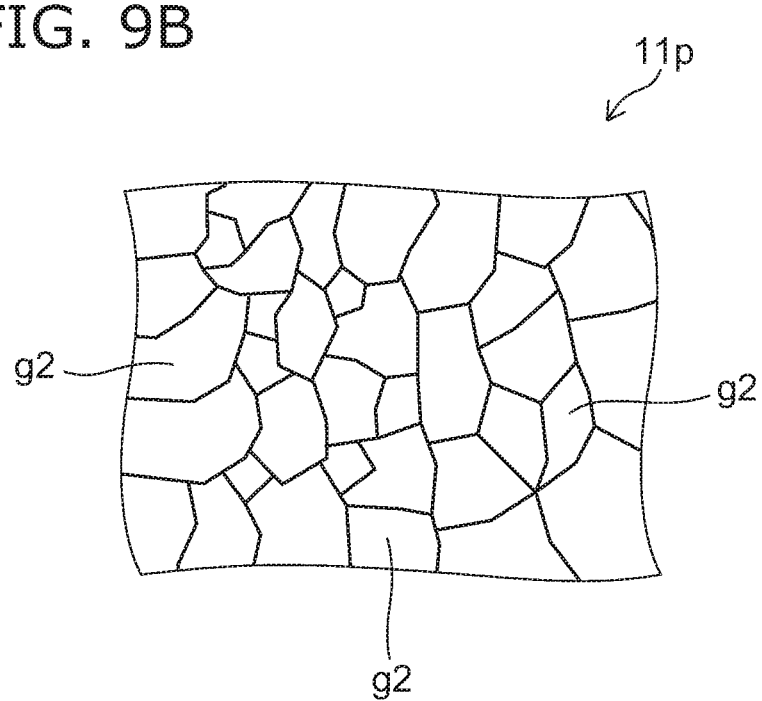

FIG. 9A and FIG. 9B are schematic cross sectional view illustrating the electrostatic chuck according to the embodiment.

FIG. 9A is an enlarged view a portion of the first region 90p shown in FIG. 8. FIG. 9B is an enlarged view of a portion of the first substrate region 11p shown in FIG. 8.

As shown in FIG. 9A, the first region 90p includes multiple particles g1 (crystal grain). As shown in FIG. 9B, the first substrate region 11p includes multiple particles g2 (crystal grain).

An average particle diameter (an average value of diameters of the multiple particles g1) is different from an average particle diameter (an average value of diameters of the multiple particles g2) in the first substrate region 11p.

Since the average particle diameter in the first region 90p and the average particle diameter in the first substrate region 11p are different, a bonding strength (interface strength) between the crystal grain of the first porous part 90 and the crystal grain of the ceramic dielectric substrate 11 can be improved at the interface F1. For example, separation of the first porous part 90 from the ceramic dielectric substrate 11 and shedding of the crystal grain can be suppressed.

An average value of an equivalent circular diameter of the crystal grain in the cross sectional image such as FIG. 9A and FIG. 9B can be used for the average particle diameter. The equivalent circular diameter is a diameter of a circle having the same area as the area of the planar shape of the object.

The ceramic dielectric substrate 11 and the first porous part 90 are also favorably integrated. The first porous part 90 is integrated with the ceramic dielectric substrate 11, and thus fixed to the ceramic dielectric substrate 11. Thereby, in comparison with the case of fixing the first porous part 90 to the ceramic dielectric substrate 11 by the adhesive or the like, the strength of the electrostatic chuck 110 can be improved. For example, degradation of the electrostatic chuck due corrosion or erosion of the adhesive does not occur.

In this example, the average particle diameter in the first substrate region 11p is smaller than the average particle diameter in the first region 90p. Since the particle diameter in the first substrate region 11p is small, the bonding strength between the first porous part 90 and the ceramic dielectric substrate 11 can be improved at the interface between the first porous part 90 and the ceramic dielectric substrate 11. Since the particle diameter in the first substrate region 11p is small, the strength of the ceramic dielectric substrate 11 can be improved and risk of crack or the like due to a stress generated in manufacturing and processing can be suppressed. For example, the average particle diameter in the first region 90p is not less than 3 μm and not more than 5 μm. For example, the average particle diameter in the first substrate region 11p is not less than 0.5 μm and not more than 2 μm. The average particle diameter in the first substrate region 11p is not less than 1.1 times and not more than 5 times of the average particle diameter in the first region 90p.

For example, the average particle diameter in the first substrate region 11p is smaller than the average particle diameter in the second substrate region 11q. In the first substrate region 11p provided to contact the first region 90p, it is favorable to increase the interface strength to the first region 90p due to interaction such as diffusion or the like to the first region 90p at sintering in a manufacturing process, for example. On the other hand, in the second substrate region 11q, it is favorable that original characteristics of the material of the ceramic dielectric substrate 11 are developed. The average particle diameter in the first substrate region 11p is made smaller than the average particle diameter in the second substrate region 11q, and thus the guarantee of the interface strength in the first substrate region 11p and the characteristics of the ceramic dielectric substrate 11 in the second substrate region 11q can be compatible.

The average particle diameter in the first region 90p may be smaller than the average particle diameter in the first substrate region 11p. Thereby, at the interface between the first porous part 90 and the ceramic dielectric substrate 11, the bonding strength between the first porous part 90 and the ceramic dielectric substrate 11 can be improved. Since the average particle diameter in the first region 90p is small, the strength of the first porous part 90 increases, and thus the detachment of the particle in the processing can be suppressed and the particles can be reduced.

For example, in each of the first porous part 90 and the ceramic dielectric substrate 11, the average particle diameter can be adjusted by adjusting a sintering condition such as a material composition and a temperature. For example, the amount and concentration of the sintering aid added in the sintering of ceramic materials are adjusted. For example, magnesium oxide (MgO) used as the sintering aid suppresses abnormal growth of the crystal grain.

In the same way as described above, the average particle diameter in the first region 90p can also be smaller than the average particle diameter in the second substrate region 11q. In this way, the mechanical strength in the first region 90p can be improved.

Referring back to FIG. 2A, the description of the structure of the electrostatic chuck 110 is continued. The electrostatic chuck 110 may further include the second porous part 70. The second porous part 70 can be provided between the first porous part 90 and the gas introduction path 53 in the Z-direction. For example, the second porous part 70 is fitted to the ceramic dielectric substrate 11 side of the base plate 60. As shown in FIG. 2A, for example, a counter sunk portion 53a is provided on the ceramic dielectric substrate 11 side of the base plate 50. The counter sunk portion 53a is provided to be tubular. The second porous part 70 is fitted to the counter sunk portion 53a by adequately designing an inner diameter of the counter sunk portion 53a.

An upper surface 70U of the second porous part 70 is exposed to an upper surface 50U of the base plate 50. The upper surface 70U of the second porous part 70 is opposed to the lower surface 90L of the first porous part 90. In this example, a space SP is defined the upper surface 70U of the second porous part 70 and the lower surface 90L of the first porous part 90. The space SP may be filled with at least one of the second porous part 70 and the first porous part 90. That is the second porous part 70 and the first porous part 90 may contact.

The second porous part 70 includes a ceramic porous body 71 including multiple pores and a ceramic insulating film 72. The ceramic porous body 71 is provided to be tubular (for example, cylindrical) and is fitted to the counter sunk portion 53a. The shape of the second porous part 70 is desired to be cylindrical, however is not limited to be cylindrical. An insulative material is used for the ceramic porous body 71. The material of the ceramic porous body 71 is, for example, $Al_2O_3$, $Y_2O_3$, $ZrO_2$, MgO, SiC, AlN, $Si_3N_4$. The material of the ceramic porous body 71 may be glass such as $SiO_2$. The material of the ceramic porous body 71 may be $Al_2O_3$—$TiO_2$, $SiO_2$—MgO, $Al_2O_3$—$SiO_2$, $Al_6O_{13}Si_2$, YAG, $ZrSiO_4$ or the like.

A porosity of the ceramic porous body 71 is, for example, not less than 20% and not more than 60%. A density of the ceramic porous body 71 is, for example, not less than 1.5 g/cm$^3$ and not more than 3.0 g/cm$^3$. The gas such as He or the like which flows through the gas introduction path 53 passes through the multiple pores of the ceramic porous body 71, and is sent to the groove 14 from the through hole 15 provided in the ceramic dielectric substrate 11.

The ceramic insulating film 72 is provided between the ceramic porous body 71 and the gas introduction path 53. The ceramic insulating film 72 is denser than the ceramic porous body 71. A porosity of the ceramic insulating film 72 is, for example, not more than 10%. A density of the ceramic insulating film 72 is, for example, not less than 3.0 g/cm$^3$ and not more than 4.0 g/cm$^3$. The ceramic insulating film 72 is provided o a side surface of the ceramic porous body 71.

A material of the ceramic insulating film 72 includes, for example, $Al_2O_3$, $Y_2O_3$, $ZrO_2$, MgO or the like. The material of the ceramic insulating film 72 may include $Al_2O_3$—$TiO_2$, $Al_2O_3$—MgO, $Al_2O_3$—$SiO_2$, $Al_6O_{13}Si_2$, YAG, $ZrSiO_4$ or the like.

The ceramic insulating film 72 is formed by thermal spraying on the side surface of the ceramic porous body 71. The thermal spraying is a method that a coating is formed by melting or softening a coating material by heating, accelerating in a particular form, making collide to the side surface of the ceramic porous body 71, and coagulating/depositing flatly collapsed particles. The ceramic insulating film 72 may be manufactured by, for example, PVD (Physical Vapor Deposition), CVD, sol-gel method, aerosol deposition method or the like. In the case of forming the ceramic insulating film 72 by thermally spraying ceramic, a film thickness is, for example, not less than 0.05 mm and not more than 0.5 mm.

A porosity of the ceramic dielectric substrate 11 is, for example, not more than 1%. A density of the ceramic dielectric substrate 11 is, for example, 4.2 g/cm$^3$.

The porosities of the ceramic dielectric substrate 11 and the second porous part 70 are measured by a scanning electron microscopy as described above. The density is measured on the basis of JIS C 2141 5.4.3.

If the second porous part 70 is fitted to the counter sunk portion 53a of the gas introduction path 53, the ceramic insulating film 72 is in a state of contacting the base plate 50. That is, the ceramic porous body 71 and the ceramic insulating film 72 which are highly insulative are intervened between the through hole 15 introducing the gas such as He or the like to the groove 14 and the base plate made of a metal. This second porous part 70 is used, and thus in comparison with the case of providing only the ceramic porous body 71 in the gas introduction path 53, high insulating property can be demonstrated.

In the X-direction or the Y-direction, the dimension of the second porous part 70 can be larger than the dimension of the first porous part 90. Since a higher breakdown voltage is obtained by providing this second porous part 70, the arc discharge can be suppressed from being generated more effectively.

The multiple pores provided in the second porous part 70 are dispersed more three-dimensionally than the multiple pores provided in the first porous part 90, and thus a ratio of pores piercing in the Z-direction can be higher in the first porous part 90 than in the second porous part 70. Since the higher breakdown voltage can be obtained by providing the second porous part 70 including the multiple pores dispersed three-dimensionally, the arc discharge can be suppressed from being generated more effectively. The gas flow can be facilitated by providing the first porous part 90 having a large ratio of pores piercing in the Z-direction.

In the z-direction, the dimension of the second porous part 70 can be larger than the dimension of the first porous part 90. In this way, the higher breakdown voltage can be obtained, and thus the arc discharge can be suppressed from being generated more effectively.

An average value of the multiple pores provided in the second porous part 70 can be larger than an average value of the multiple pores provided in the first porous part 90. In this way, since the second porous part 70 having a large pore diameter is provided, the gas flow can be facilitated. Since the first porous part 90 having a small pore diameter is provided on the suction object side, the arc discharge can be suppressed from being generated more effectively.

Since the variation of the multiple pore diameters can be small, the arc discharge can be suppressed from being generated more effectively.

Figure 10:
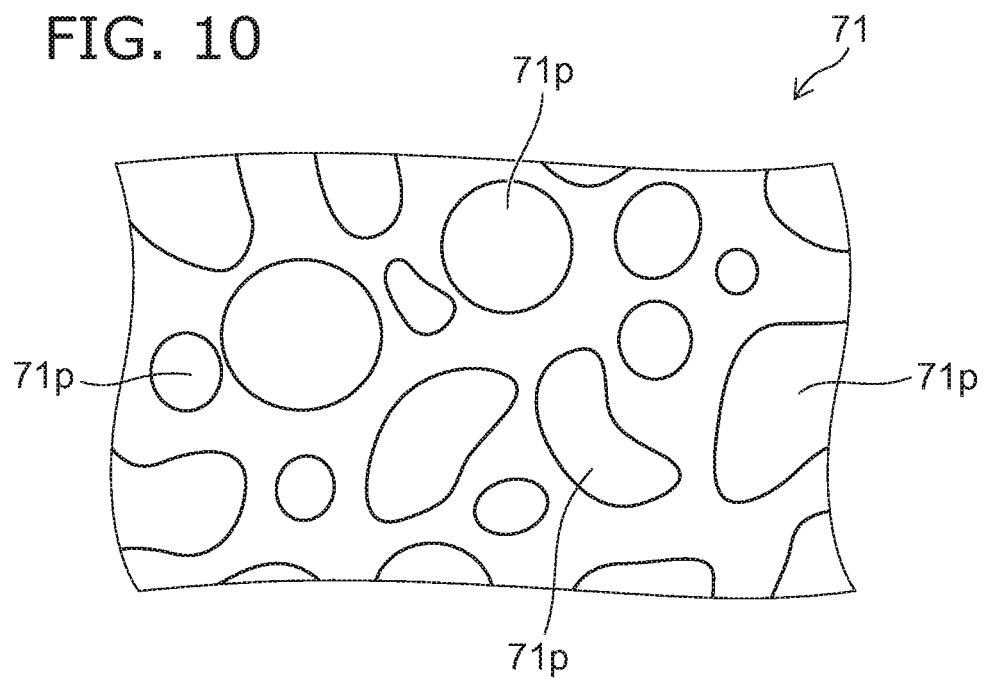
FIG. 10 is a schematic cross sectional view illustrating a second porous part of the electrostatic chuck according to the embodiment.

FIG. 10 is a schematic cross sectional view illustrating the second porous part of the electrostatic chuck according to the embodiment.

FIG. 10 is an enlarged view of a portion of the cross section of the ceramic porous body 71.

Multiple pores 71p provided in the ceramic porous body 71 are dispersed in the ceramic porous body 71 three-dimensionally in the X-direction, the Y-direction and the Z-direction. In other words, the ceramic porous body 71 has a three dimensional network structure which broadens in the X-direction, the Y-direction and the Z-direction. The multiple pores 71p are dispersed in the ceramic porous body 71, for example, randomly.

Since the multiple pores are dispersed three-dimensionally, a portion of the multiple pores 71p are exposed to a surface of the ceramic porous body 71. For that reason, fine unevenness is formed on the surface of the ceramic porous body 71. That is, the surface of the ceramic porous body 712 is rough. Since the surface of the ceramic porous body 71 is rough, the ceramic insulating film 72 which is a sprayed film can be easily formed on the surface of the ceramic porous body 71. For example, the contact of the strayed film and the ceramic porous body 71 is improved. The separation of the ceramic insulating film 72 can be suppressed.

The average value of the diameters of the multiple pores 71$p$ provided in the ceramic porous body 71 is larger than the average value of the diameters of the multiple pores 96 provided in the porous region 91. The diameter of the pores 71$p$ is not less than 10 μm and not more than 50 μm. The flow rate of the gas flowing through the through hole 15 can be controlled (restricted) by the porous region 91 having a small pore diameter. Thereby, the variation of the gas flow rate due to the ceramic porous body 71 can be suppressed. The measurement of the diameter of the pores 71$p$ and the diameter of the pores 96 can be performed by a scanning electron microscopy as described previously.

Figure 11:
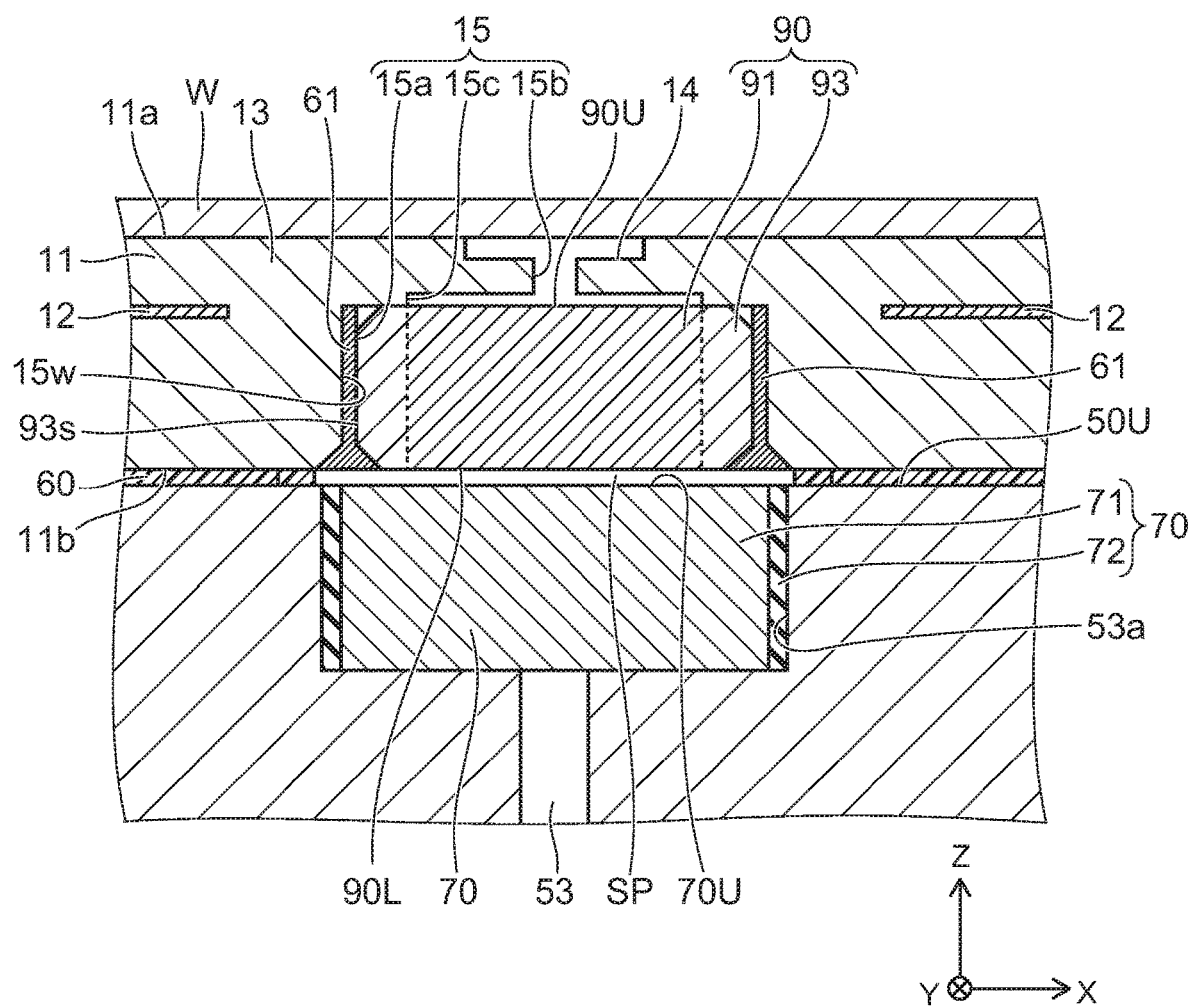
FIG. 11 is a schematic cross sectional view illustrating another electrostatic chuck according to the embodiment.

FIG. 11 is a schematic cross sectional view illustrating another electrostatic chuck according to the embodiment.

FIG. 11 illustrates around the first porous part 90 as well as FIG. 2A.

In this example, the first porous part 90 is not integrated with the ceramic dielectric substrate 11.

The adhesive member 61 (adhesive) is provided between the first porous part 90 and the ceramic dielectric substrate 11. The first porous part 90 is adhered to the ceramic dielectric substrate 11 by the adhesive member 61. For example, the adhesive member 61 is provided between the side surface of the first porous part 90 (the side surface 93$s$ of the dense region 93) and the inner wall 15$w$ of the through hole 15. The first porous part 90 and the ceramic dielectric substrate 11 may not contact.

A silicone adhesive is used for the adhesive member 61, for example. The adhesive member 61 is, for example, an elastic member having elasticity. Elasticity of the adhesive member 61 is, for example, lower than elasticity of the dense region 93 of the first porous part 90, and lower than elasticity of the ceramic dielectric substrate 11.

In the structure where the first porous part 90 and the ceramic dielectric substrate 11 are adhered by the adhesive member 61, the adhesive member 61 can be a buffer material to a difference between heat shrinkage of the first porous part 90 and heat shrinkage of the ceramic dielectric substrate 11.

The embodiments of the invention have been described. However the invention is not limited to the descriptions. For example, the configuration of the electrostatic chuck 110 based on Coulomb force has been illustrated, however the configuration based on Johnson-Rahbeck force is also applicable. Any design change of components, or any addition, omission in the above embodiments suitably made by those skilled in the art are also encompassed within the scope of the invention as long as they fall within the spirit of the invention. Further, any components of the embodiments may be combined within the extent of technical feasibility and are included in the scope of the invention to the extent that the feature of the invention is included.

What is claimed is:

1. An electrostatic chuck, comprising:
a ceramic dielectric substrate having a first major surface placing a suction object and a second major surface on an opposite side to the first major surface;
a base plate supporting the ceramic dielectric substrate and including a gas introduction path; and
a first porous part provided at a position between the base plate and the first major surface of the ceramic dielectric substrate and being opposite to the gas introduction path,
the ceramic dielectric substrate including a first hole part positioned between the first major surface and the first porous part,
at least one of the ceramic dielectric substrate or the first porous part including a second hole part positioned between the first hole part and the first porous part, and
in a second direction perpendicular to a first direction from the base plate toward the ceramic dielectric substrate, a dimension of the second hole part being smaller than a dimension of the first porous part and larger than a dimension of the first hole part.

2. The electrostatic chuck according to claim 1, wherein the second hole part is provided in the ceramic dielectric substrate.

3. The electrostatic chuck according to claim 1, wherein the second hole part is provided in the first porous part.

4. The electrostatic chuck according to claim 1, wherein
the ceramic dielectric substrate further includes at least one groove communicating with the first hole part and opening to the first major surface, and
a dimension of the second hole part is smaller than a dimension of the groove in the first direction.

5. The electrostatic chuck according to claim 1, further comprising:
an adhesion part provided between the ceramic dielectric substrate and the base plate,
a dimension of the second hole part being smaller than a dimension of the adhesion part in the first direction.

6. The electrostatic chuck according to claim 1, further comprising:
a second porous part provided between the first porous part and the gas introduction path and including a plurality of pores,
an average value of diameters of the plurality of pores provided in the second porous part being larger than an average value of diameters of the plurality of pores provided in the first porous part.

7. The electrostatic chuck according to claim 6, wherein
the plurality of pores provided in the second porous part is more dispersed three dimensionally than the plurality of pores provided in the first porous part, and
a ratio of pores piercing in the first direction is larger in the first porous part than the second porous part.

8. The electrostatic chuck according to claim 1, further comprising:
a second porous part provided between the first porous part and the gas introduction path and including a plurality of pores,
fluctuation of diameters of a plurality of pores provided in the first porous part being smaller than fluctuation of diameters of the plurality of pores provided in the second porous part.

9. The electrostatic chuck according to claim 1, further comprising:
a second porous part provided between the first porous part and the gas introduction path, wherein
a plurality of pores provided in the second porous part are more dispersed three dimensionally than a plurality of pores provided in the first porous part, and
a ratio of pores piercing in the first direction is larger in the first porous part than the second porous part.

10. The electrostatic chuck according to claim 1, wherein the first porous part and the ceramic dielectric substrate include aluminum oxide as a main component, and a purity of aluminum oxide of the ceramic dielectric substrate is higher than a purity of aluminum oxide of the first porous part.

11. The electrostatic chuck according to claim 1, wherein
the first porous part includes a plurality of sparse portions and a dense portion, the sparse portions including a plurality of pores including a first pore and a second pore, the dense portion having a density higher than a density of the sparse portions,
each of the plurality of sparse portions extends in the first direction,
the dense portion is positioned between the plurality of sparse portions,
the sparse portions include a wall part provided between the first pore and the second pore, and
a minimum value of a dimension of the wall part is smaller than a minimum value of a dimension of the dense portion in the second direction.

12. The electrostatic chuck according to claim 11, wherein a dimension of the plurality of pores provided in each of the plurality of sparse portions is smaller than a dimension of the dense portion in the second direction.

13. The electrostatic chuck according to claim 11, wherein an aspect ratio of the plurality of pores provided in each of the plurality of sparse portions is not less than 30 and not more than 1000.

14. The electrostatic chuck according to claim 11, wherein a dimension of the plurality of pores provided in each of the plurality of sparse portions is not less than 1 micrometer and not more than 20 micrometers in the second direction.

15. The electrostatic chuck according to claim 11, wherein when viewed along the first direction, the first pore is positioned at a center portion of the sparse portions, and
a number of pores of the plurality of pores adjacent to the first pore and surrounding the first pore is 6.

* * * * *